(12) United States Patent
Johnsgard et al.

(10) Patent No.: US 6,172,337 B1
(45) Date of Patent: Jan. 9, 2001

(54) SYSTEM AND METHOD FOR THERMAL PROCESSING OF A SEMICONDUCTOR SUBSTRATE

(75) Inventors: Kristian E. Johnsgard; Brad S. Mattson, both of Los Gatos; James McDiarmid, Pleasanton; Vladimir J. Zeitlin, Santa Clara, all of CA (US)

(73) Assignee: Mattson Technology, Inc., Fremont, CA (US)

( * ) Notice: Under 35 U.S.C. 154(b), the term of this patent shall be extended for 0 days.

(21) Appl. No.: 09/349,523

(22) Filed: Jul. 8, 1999

Related U.S. Application Data

(62) Division of application No. 08/499,986, filed on Jul. 10, 1995, now Pat. No. 6,002,109.

(51) Int. Cl.[7] .......................... C23C 16/00; H01L 21/302
(52) U.S. Cl. ........................ 219/390; 118/725; 438/795
(58) Field of Search .............................. 219/390, 399, 219/400, 411; 118/725, 728, 50.1; 432/152; 373/110; 438/795, 799

(56) References Cited

U.S. PATENT DOCUMENTS 5,676,205 * 10/1997 White ................................ 118/725

FOREIGN PATENT DOCUMENTS

| 2499228 | * | 8/1982 | (FR) . |
| 63-229716 | * | 9/1988 | (JP) . |
| 3-206613 | * | 9/1991 | (JP) . |

* cited by examiner

Primary Examiner—Joseph Pelham
(74) Attorney, Agent, or Firm—Wilson Sonsini Goodrich & Rosati

(57) ABSTRACT

A semiconductor substrate processing system and method using a stable heating source with a large thermal mass relative to conventional lamp heated systems. The system dimensions and processing parameters are selected to provide a substantial heat flux to the wafer while minimizing heat loss to the surrounding environment (particularly from the edges of the heat source and wafer). The heat source provides a wafer temperature uniformity profile that has a low variance across temperature ranges at low pressures. A resistively heated block is substantially enclosed within an insulated vacuum cavity used to heat the wafer. A vacuum region is preferably provided between the heated block and the insulating material as well as between the insulating material and the chamber wall. Heat transfer across the vacuum regions is primarily achieved by radiation, while heat transfer through the insulating material is achieved by conduction. The wafer is placed on or near the heated block within the vacuum cavity for heating by conduction and radiation. The rate of heating may be controlled by varying pressure across a range of very low pressures.

23 Claims, 17 Drawing Sheets

Heat Transfer at Various Pressures

| Pressure | 2 Torr | | 200 Torr | | 760 Torr | |
|---|---|---|---|---|---|---|
| Heating Surface Temperature | 600°C | 800°C | 600°C | 800°C | 600°C | 800°C |
| Heat Flux (W/cm$^2$) | .53 | 1.17 | .67 | 1.38 | .84 | 1.63 |
| % Radiation | 88.6 | 92.9 | 70.2 | 78.8 | 55.9 | 66.5 |
| % Convection | -0 | -0 | 20.8 | 15.2 | 36.9 | 28.5 |
| % Conduction | 11.4 | 7.1 | 9.0 | 6.0 | 7.2 | 5.1 |
| Biot Number | .0037 | .0059 | .0046 | .0070 | .0058 | .0083 |

Figure 8

Chamber Surface Temperatures at 10 Torr

| Heating Surface to Wafer Gap (inches) | 0.002 | 0.005 | 0.010 | 0.020 | 0.040 | 0.060 | 0.080 | 0.10 | 0.20 | 0.40 | 0.60 | 0.80 | 1.00 |
|---|---|---|---|---|---|---|---|---|---|---|---|---|---|
| $T_W = °C$ | 795.0 | 789.0 | 781.7 | 772.5 | 763.2 | 758.4 | 755.5 | 753.6 | 749.2 | 746.6 | 745.7 | 745.2 | 744.9 |
| $T_L = °C$ | 681.6 | 676.0 | 669.0 | 660.3 | 657.5 | 647.0 | 644.3 | 642.5 | 638.3 | 635.8 | 634.9 | 634.5 | 634.2 |
| $T_U = °C$ | 653.8 | 648.7 | 642.4 | 634.5 | 626.5 | 622.4 | 619.9 | 618.3 | 614.4 | 612.2 | 611.4 | 611.0 | 610.7 |
| Heat Flux (W/cm²) | 1.021 | 1.001 | .977 | .948 | .918 | .903 | .895 | .889 | .875 | .867 | .865 | .863 | .862 |

Chamber wall temperature = 50 °C
Heating surface temperature = 800 °C
Pressure = 10 Torr

Figure 10C

POST-ANNEAL

PRE-ANNEAL

SYSTEM AND METHOD FOR THERMAL PROCESSING OF A SEMICONDUCTOR SUBSTRATE

REFERENCE TO RELATED APPLICATION

This application is a divisional of U.S. application Ser. No. 08/499,986 filed Jul. 10, 1995 now U.S. Pat. No. 6,002,109. U.S. application Ser. No. 08/499,986 is hereby incorporated herein by reference in its entirety.

BACKGROUND OF THE INVENTION

1. Field of the Invention

The field of the present invention relates in general to semiconductor processing. More particularly, the field of the invention relates to a system and method for thermally processing a semiconductor substrate using a stable temperature heat source.

2. Background

Diffusion furnaces have been widely used for thermal processing of semiconductor device materials (such as semiconductor wafers or other semiconductor substrates). The furnaces typically have a large thermal mass that provides a relatively uniform and stable temperature for processing. However, in order to achieve uniform results, it is necessary for the conditions in the furnace to reach thermal equilibrium after a batch of wafers is inserted into the furnace. Therefore, the heating time for wafers in a diffusion furnace is relatively long, typically exceeding ten minutes.

As integrated circuit dimensions have decreased, shorter thermal processing steps for some processes, such as rapid thermal anneal, are desirable to reduce the lateral diffusion of dopants and the associated broadening of feature dimensions. Thermal process duration may also be limited to reduce forward diffusion so the semiconductor junction in the wafer does not shift. As a result, the longer processing times inherent in conventional diffusion furnaces have become undesirable for many processes. In addition, increasingly stringent requirements for process control and repeatability have made batch processing undesirable for many applications.

As an alternative to diffusion furnaces, single wafer rapid thermal processing (RTP) systems have been developed for rapidly heating and cooling wafers. Most RTP systems use high intensity lamps (usually tungsten-halogen lamps or arc lamps) to selectively heat a wafer within a cold wall clear quartz furnace. Since the lamps have very low thermal mass, the wafer can be heated rapidly. Rapid wafer cooling is also easily achieved since the heat source may be turned off instantly without requiring a slow temperature ramp down. Lamp heating of the wafer minimizes the thermal mass effects of the process chamber and allows rapid real time control over the wafer temperature. While single wafer RTP reactors provide enhanced process control, their throughput is substantially less than batch furnace systems.

FIG. 1 is a graph illustrating a desired heating profile for a wafer during rapid thermal processing in a lamp heated RTP system. In particular, the solid line in FIG. 1 is a plot of the temperature of the center of a wafer over the duration of a rapid thermal annealing process. As shown in FIG. 1, the wafer may be heated at a rapid rate as indicated at 102 in FIG. 1. Lamp radiation may be rapidly adjusted as a desired processing temperature is approached in order to achieve a constant processing temperature, as indicated at 104. At the end of the processing step, the lamp radiation may be quickly reduced to allow cooling as indicated at 106.

While RTP systems allow rapid heating and cooling, it is difficult to achieve repeatable, uniform wafer processing temperatures using RTP, particularly for larger wafers (200 mm and greater). The temperature uniformity is sensitive to the uniformity of the optical energy absorption as well as the radiative and convective heat losses of the wafer. Wafer temperature nonuniformities usually appear near wafer edges because radiative heat losses are greatest at the edges. During RTP the wafer edges may, at times, be several degrees (or even tens of degrees) cooler than the center of the wafer. At high temperatures, generally greater than eight hundred degrees Celsius (800° C.), this nonuniformity may produce crystal slip lines on the wafer (particularly near the edge). To minimize the formation of slip lines, insulating rings are often placed around the perimeter of the wafer to shield the wafer from the cold chamber walls. Nonuniformity is also undesirable since it may lead to nonuniform material properties such as alloy content, grain size, and dopant concentration. These nonuniform material properties may degrade the circuitry and decrease yield even at low temperatures (generally less than 800° C.). For instance, temperature uniformity is critical to the formation of titanium silicide by post deposition annealing. In fact, the uniformity of the sheet resistance of the resulting titanium silicide is regarded as a standard measure for evaluating temperature uniformity in RTP systems.

Temperature levels and uniformity must therefore be carefully monitored and controlled in RTP systems. Optical pyrometry is typically used due to its noninvasive nature and relatively fast measurement speed which are critical in controlling the rapid heating and cooling in RTP. However, accurate temperature measurement using optical pyrometry depends upon the accurate measurement of the intensity of radiation emitted from the wafer and upon the wafer's radiation emitting characteristics or emissivity. Emissivity is typically wafer dependent and depends on a range of parameters, including temperature, chamber reflectivity, the wafer material (including dopant concentration), surface roughness, and surface layers (including the type and thickness of sub-layers), and will change dynamically during processing as layers grow on the surface of the wafer. In addition, radiation from heat sources, particularly lamps, reflect off the wafer surface and interfere with optical pyrometry. This reflected radiation erroneously augments the measured intensity of radiation emitted from the wafer surface and results in inaccurate temperature measurement.

Increasingly complex systems have been developed for measuring emissivity and for compensating for reflected radiation. One approach uses two optical pyrometers—one for measuring the radiation from the lamps and one for measuring the radiation from the wafer. The strength of the characteristic AC ripple in radiation emanated from the lamp can be compared to the strength of the AC ripple reflected from the wafer to determine the wafer's reflectivity. This, in turn, can be used to essentially subtract out reflected radiation in order to isolate the emitted radiation from the wafer for determining temperature using Planck's equation. See, e.g., U.S. Pat. No. 5,166,080 to Schietinger et al. However, such systems may require complex circuitry to isolate the AC ripple and perform the calculations that effectively eliminate reflected radiation. Such systems also require an additional optical sensor and other components.

Another approach for measuring wafer temperature and compensating for the effects of emissivity uses an infrared laser source that directs coherent light into a beam splitter. From the beam splitter, the coherent light beam is split into numerous incident beams which travel to the wafer surface via optical fiber bundles. The optical fiber bundles also collect the reflected coherent light beams as well as radiated energy from the wafer. In low temperature applications, transmitted energy may be collected and measured as well. The collected light is then divided into separate components from which radiance, emissivity, and temperature may be calculated. See, e.g., U.S. Pat. No. 5,156,461 to Moslehi et al. It is a disadvantage of such systems that a laser and other complex components are required. Such systems, however, are advantageous because they may provide measurements of wafer temperature at multiple points along the wafer surface which may be useful for detecting and compensating for temperature nonuniformities.

In order to compensate for temperature nonuniformities, a heater with multiple independently controlled heating zones may be required. One approach is to use a multi-zone lamp system arranged in a plurality of concentric circles. The lamp energy may be adjusted to compensate for temperature differences detected using multi-point optical pyrometry. However, such systems often require complex and expensive lamp systems with separate temperature controls for each zone of lamps. For instance, U.S. Pat. No. 5,268,989 to Moslehi et al. discloses a multi-zone heater with sixty five tungsten-halogen lamps arranged into four heating zones. In addition, a light interference elimination system is disclosed which uses light pipes in seven dummy lamps to measure lamp radiation as well as five or more light pipes for measuring radiation across the surface of the wafer. The light interference elimination system uses the radiation of the dummy lamps to determine the fraction of total radiation from the wafer surface that is reflected from the lamps as opposed to emitted from the wafer surface. The emitted radiation can then be isolated and used to detect temperature across the wafer surface, which in turn can be used to control the lamp heating zones.

A widely used exemplary RTP system is the Heatpulse™ 8108 system from AG Associates shown in cross section in FIG. 2. According to published technical specifications, this system uses twenty eight tungsten halogen lamps in cross configuration with ten software controlled heat zones. In process specifications for this system, the uniformity of titanium silicide formation on a 200 mm wafer is reported to be 1.5% nonuniformity added to as-sputtered titanium wafer uniformity. A throughput of around twenty five (25) wafers per hour is reported for this process.

While multi-zone lamp systems have enhanced wafer temperature uniformity, their complexity has increased cost and maintenance requirements. In addition, other problems must be addressed in lamp heated RTP systems. For instance, many lamps use linear filaments which provide heat in linear segments and as a result are ineffective or inefficient at providing uniform heat to a round wafer even when multi-zone lamps are used. Furthermore, lamp systems tend to degrade with use which inhibits process repeatability and individual lamps may degrade at different rates which reduces uniformity. In addition, replacing degraded lamps increases cost and maintenance requirements.

In order to overcome the disadvantages of lamp heated RTP systems, a few systems have been proposed which use a resistively heated plate. Such heated plates provide a relatively large thermal mass with a stable temperature. FIG. 3 shows a side cross sectional view of a conventional heated plate rapid thermal processor. Referring to FIG. 3, a wafer may be placed on or near a heated plate 304 for thermal processing. The wafer enters the chamber through a port 306 formed in the chamber wall 308. The wafer is placed on support pins 310 which may be raised and lowered for loading and unloading the wafer. For processing, the wafer is lowered onto or close to the heated late 304. The heated plate is heated by a resistive heater 312, and the wafer is rapidly heated by conduction, convection, and radiation from the heated plate. Since the heated late is a constant and substantial source of heat, a reflective heat shield 314 may be necessary in order to protect the chamber walls 308. Temperature is monitored in the system of FIG. 3 using a thermocouple 316 disposed in the heater plate, as opposed to an optical pyrometer which may be affected by emissivity variations. However, it is the temperature of the heated plate 304 that is directly measured by the thermocouple and not the temperature of the wafer.

While the heated plate 304 provides a stable, repeatable heating source with a large thermal mass, similar to a diffusion furnace, the chamber walls 308 be cooled. This allows a wafer to be rapidly heated by lowering the wafer onto the heated plate for a short period of time and rapidly cooled by removing the wafer from the plate. In addition, a radiation absorbing material may be used to coat the top surface of the chamber to enhance cooling as the wafer is raised by the pins after heating. See U.S. Pat. Nos. 5,060,354 and 5,252,807 to Chizinsky.

While heated plate rapid thermal processors provide a stable temperature on the heated plate that may be measured using a thermocouple, problems may be encountered with wafer temperature nonuniformities. Wafers may be heated by placing them near the heated plate rather than on the plate. In such systems, the edges of the wafer may have large heat losses which lead to nonuniformities as in lamp heated RTP systems. Even when a wafer is placed in contact with a heated plate, there may be nonuniformities. The heated plate itself may have large edge losses, because: 1) the comers and edges of the plate may radiate across a wider range of angles into the chamber; 2) vertical chimney effects may cause larger convective beat losses at the edges of the heated plate; and 3) the edges of the heated plate may be close to cold chamber walls. These edge losses on the plate may, in turn, impose temperature nonuniformities upon a wafer placed on the plate.

In addition, heat loss and temperature uniformity across the wafer surface varies with temperature and pressure. Conductive heat transfer between two objects (such as the wafer and the cold chamber wall) is proportional to the temperature difference between the objects and radiative heat transfer is proportional to the difference of the temperatures raised to the fourth power ($T_1^4 - T_{2hu\ 4}$). Thus, the difference between temperatures across the wafer surface will increase at higher processing temperatures. In addition, the pressure in the chamber may affect the wafer temperature profile since heat transfer at low pressures is predominantly carried out by radiation, while heat transfer at higher pressures involves a combination of radiation, conduction and convection.

As with lamp heated RTP systems, a variety of techniques may be used to enhance wafer temperature uniformity. For instance, the reactor of FIG. 3 includes a wall 317 extending upward from the perimeter of the heated plate. The wall 317 is intended to help maintain the uniformity of the temperature across the diameter of the wafer, as the wafer is displaced on the pins, away from the heated plate. However, it is believed that the cold chamber walls, which are close to and directly exposed to the upstanding wall and portions of the heated plate, will induce temperature and process nonuniformities. In addition, the effect of the wall will vary across temperature and pressure ranges.

Conventional heated plate processing systems also tend to be energy inefficient. The heated plate is maintained at a high temperature with constant conductive, convective and radiative losses to the cold chamber walls. While conductive and convective losses may be reduced at lower pressures, this inhibits the heat transfer to the wafer. At low pressures where heating is primarily radiative, the wafer may be significantly cooler than the heated plate particularly when proximity heating is used. This makes the wafer temperature difficult to control. Further, at low pressures where radiation is the primary mechanism for heat transfer, the variance in wafer temperature uniformity across temperature ranges may be greater because heat transfer by radiation is proportional to the difference between surface temperatures raised to the fourth power ($T_1^4-T_2^4$). Thus, decreasing pressure to increase energy efficiency may make the wafer temperature and uniformity more difficult to control.

Another disadvantage associated with conventional heated plate processors is that their large thermal mass prevents the rate of heating from being rapidly adjusted to achieve desired temperature profiles, such as the rapid thermal anneal profile shown in FIG. 1. When a wafer is placed near a constant temperature heat source, such as a heated plate with a large thermal mass, it has an asymptotic temperature profile over time as shown in FIG. 4. The wafer initially heats rapidly as shown by the portion of the curve indicated at 404. As the wafer temperature approaches the temperature of the plate, the rate of heating slows and the temperature of the wafer approaches the temperature of the heated plate asymptotically as shown by the portion of the curve indicated at 406. Since the large thermal mass prevents the temperature of the heated plate from being rapidly adjusted, the desired temperature profile of FIG. 1 will not be achieved.

Additional problems may also be encountered in conventional heated plate processors. In particular, a graphite heater may be desired due to its advantageous heating properties; however, graphite heaters are often fragile and easily damaged by shear strain. Thus, a graphite heater may be damaged when it is clamped or mounted to a support or electrode, and it is often difficult to provide a reliable electrical connection between a graphite heater and a power source. In addition, if a heater is mounted with a vertical support as indicated at 318 in FIG. 3, it may expand vertically during heating. This necessitates a clearance distance between the resistive heater and the heated block to allow for different levels of expansion at different temperatures. However, for efficient heating it is preferred that the resistive heater be closely spaced to the heated block.

As a result of the problems associated with conventional heated plate rapid thermal processors, they have not been adopted in the industry as a viable alternative to lamp heated RTP systems. A 1993 survey of RTP equipment covering twenty two different vendors' products indicates that, at the time of the survey, only one non-lamp system was available. See Roozeboom, "Manufacturing Equipment Issues in Rapid Thermal Processing," Rapid Thermal Processing at 349–423 (Academic Press 1993). The only non-lamp system listed uses a resistively heated bell jar with two temperature zones and is not a heated plate reactor. See U.S. Pat. No. 4,857,689 to Lee. Currently, the RTP market is dominated by lamp based systems and despite the many problems associated with such systems, they have been widely accepted over proposed heated plate approaches. Despite the potential that heated plate approaches offer for a stable and repeatable heat source, it is believed that problems with energy efficiency, uniformity, temperature and heating rate control, and the deployment of fragile, noncontaminating resistive heaters have made such systems unacceptable in the marketplace.

What is needed is a system and method for rapid thermal processing with a stable and repeatable heating source that provides a high level of uniformity across a wide range of temperatures. Preferably, the heating source would be maintained at a high temperature without necessitating rapid heating and cooling of the heating source. In addition, such a system would preferably be energy efficient while providing accurate wafer temperature control that is substantially independent of variances in wafer emissivity and would allow a cold walled chamber to be used. Preferably such a system would also provide substantially improved throughput over conventional single wafer RTP systems while maintaining a high level of process control and wafer temperature uniformity. Such a system would also preferably provide a compact heating source that is not significantly larger than the wafers being heated.

What is also needed is a system and method for thermal processing of a wafer using a heating source with a relatively large, stable thermal mass while allowing the rate of heating to be rapidly adjusted to achieve desired temperature profiles. Preferably such a system would allow a wafer to be heated at a rapid rate until a desired temperature is achieved and then allow the rate of heating to be quickly adjusted to maintain the temperature at a relatively constant level. In addition, such a system would preferably allow thermal processing of wafers with a temperature profile, uniformity and throughput competitive with conventional lamp RTP systems.

What is also needed is an improved system and method for deploying a fragile, resistive heater. Preferably such a system would allow a graphite heater to be mounted to a power source with an improved electrical connection and with substantially reduced potential for damage due to shear strain. In addition, such a system would preferably allow a graphite heater to be mounted closely to a heated block without significant vertical expansion across a wide range of temperatures.

Preferably, each of the above features would be combined in a single compact, cost-effective RTP system and method.

SUMMARY OF THE INVENTION

One aspect of the present invention provides a semiconductor substrate processing system and method using a stable heating source with a large thermal mass relative to conventional lamp heated systems. The system dimensions and processing parameters are preferably selected to provide a substantial heat flux to the wafer while minimizing heat loss to the surrounding environment (particularly from the edges of the heat source and wafer). The heat source provides a wafer temperature uniformity profile that has a low variance across temperature ranges at low pressures. This may be accomplished in one embodiment of the invention by insulating a resistively heated block at the edges and corners using a noncontaminating, substantially nontransmissive insulating material. Preferably, the entire block is substantially enclosed within an insulated vacuum cavity used to heat the wafer. A vacuum region is preferably provided between the heated block and the insulating material as well as between the insulating material and the chamber wall. Heat transfer across the vacuum regions is primarily achieved by radiation, while heat transfer through the insulating material is achieved by conduction. The wafer is placed on or near the heated block within the vacuum cavity for heating by conduction and radiation.

It is an advantage of this aspect of the present invention that the reactor heating profile may be statically adjusted to provide a high level of processing uniformity across a wide range of temperatures. In addition, a consistent uniformity profile may be maintained across a wide range of temperatures at vacuum pressures with a single zone heater even though radiative heat transfer is predominant and is exponentially dependent on temperature. This allows titanium suicide anneal to be performed with virtually no added nonuniformity which is a significant improvement over typical lamp systems with multiple, independently controlled heating zones. It is a further advantage that a compact heat source may be closely spaced to cold chamber walls without substantial temperature nonuniformities. This provides a smaller footprint for the reactor without diminishing uniformity and allows the chamber to be easily purged to control pressure. It is a further advantage of this aspect of the present invention that energy efficiency is substantially improved without substantially increasing variance in wafer temperature uniformity across temperature ranges.

A further aspect of the present invention provides a system and method for rapidly adjusting the rate of heating provided by a heat source without substantially changing the temperature of the heat source. This may be accomplished in one embodiment of the invention by adjusting the processing pressure to adjust the heating rate. Preferably, a wafer is initially heated at a pressure that allows conductive and radiative heat transfer. As a desired processing temperature is approached, the pressure may be lowered to reduce the amount of conductive heat transfer and thereby reduce the rate of heating. In particular, it is desirable to vary the pressure in this manner across a range of low pressures where a small change in pressure has a large effect on the rate of heating. Preferably, multiple pressures are used to provide a rapid heat ramp up to a processing temperature that is then maintained at a relatively constant level.

It is an advantage of this aspect of the present invention that a wide variety of process temperature profiles may be achieved using a heater at a substantially constant temperature and/or having a relatively large thermal mass. It is a further advantage of this aspect of the present invention that rapid thermal processing may be carried out using a stable heating source.

Yet another aspect of the present invention provides a system and method for uniformly heating multiple wafers at a time using a stable heating source. In one embodiment this capability is provided by using an oval shaped heating block and a resistive heater. The resistance of the heater is varied across the span of the block to provide uniform and repeatable heating for two wafers placed on the block at the same time. It is an advantage of this aspect of the present invention that wafer throughput is substantially increased without a substantial decrease in process control and uniformity.

Further aspects of the present invention provide an improved system and method for deploying a fragile resistive heater. In one embodiment, a mounting block may be placed on a rod that holds it in place while allowing the block to swivel, so shear stress does not have to be placed on the heater during mounting. Further, clamps may be positioned such that thermal expansion causes compressive stress to hold the heater in lace without shear stress. Additionally, a flexible conductive sheet may be used to provide power to the mounting block. Preferably the conductive sheet flexes to reduce shear stress on the heater. Preferably, the heater is also mounted horizontally to avoid substantial vertical expansion.

It is an advantage of these aspects of the present invention that an expensive and fragile graphite heater may be used with substantially reduced risk of damage due to shear stress. It is a further advantage that a heater may be closely spaced to an object being heated without requiring substantial clearance for thermal expansion.

In addition, aspects of the present invention provide for improved coupling of a resistive heater to a power source. In one embodiment, a malleable conductive material is clamped between a resistive heater and power source to provide an improved electrical connection. In addition, coatings are removed from each clamped surface of the resistive heater to improve conduction between the heater and a power source.

BRIEF DESCRIPTION OF THE DRAWINGS

These and other features and advantages of the present invention will become more apparent to those skilled in the art from the following detailed description in conjunction with the appended drawings in which:

FIG. 8 is a table illustrating the percent of heat transfer between two surfaces due to radiation, conduction, and convection at various pressures and temperatures;

FIG. 10C is a table illustrating the temperature of chamber surfaces calculated using the model of FIG. 10A at various heating surface to wafer gaps;

FIG. 14A is a graph illustrating the temperature of wafers heated at 2 Torr and 50 Torr in the chamber according to the first embodiment.

DETAILED DESCRIPTION

One aspect of the present invention allows a stable heating source to be used for rapid thermal processing. The following description is presented to enable any person skilled in the art to make and use the invention. Descriptions of specific designs are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
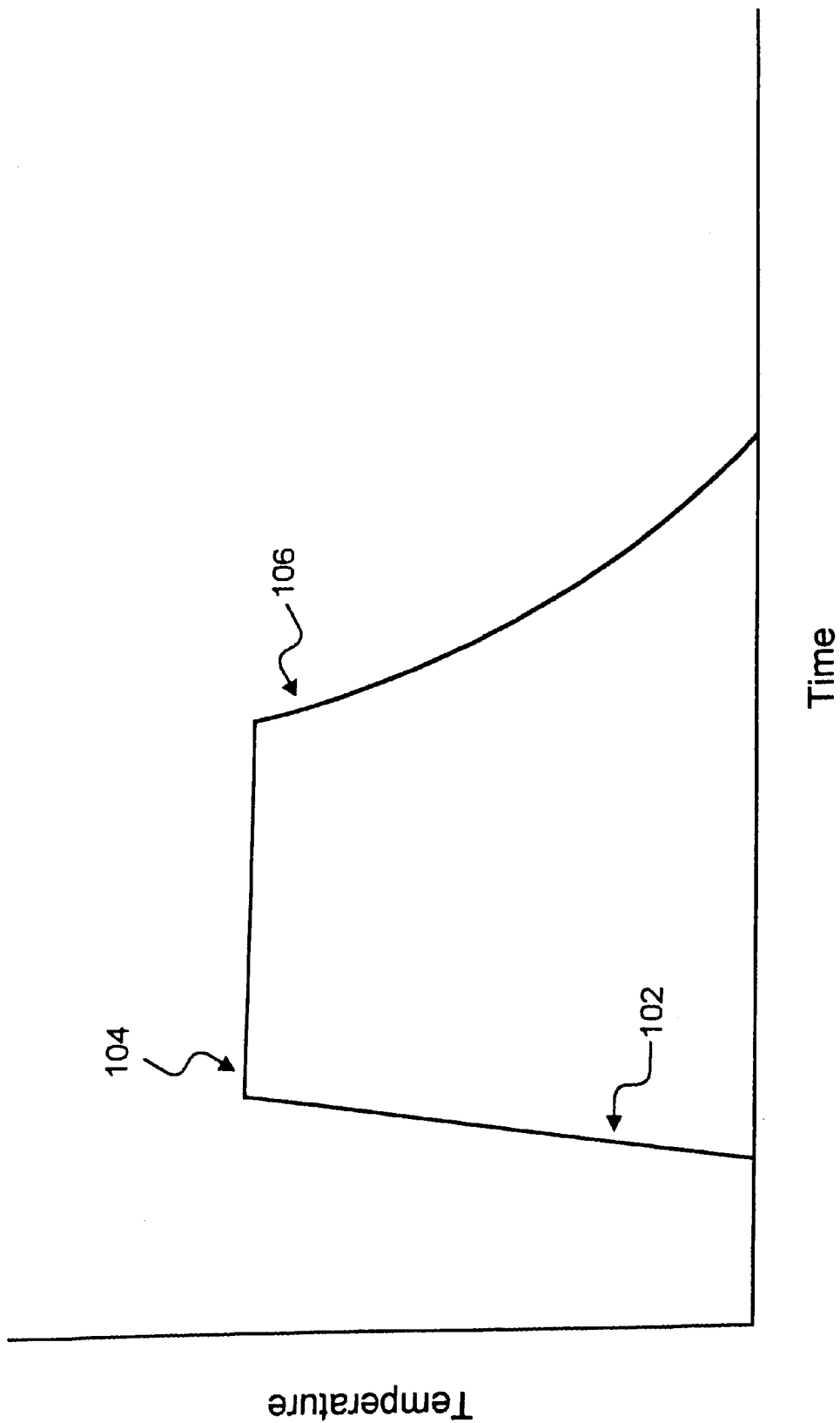
FIG. 1 is a graph of a desired wafer temperature profile for a rapid thermal annealing process.
Figure 2:
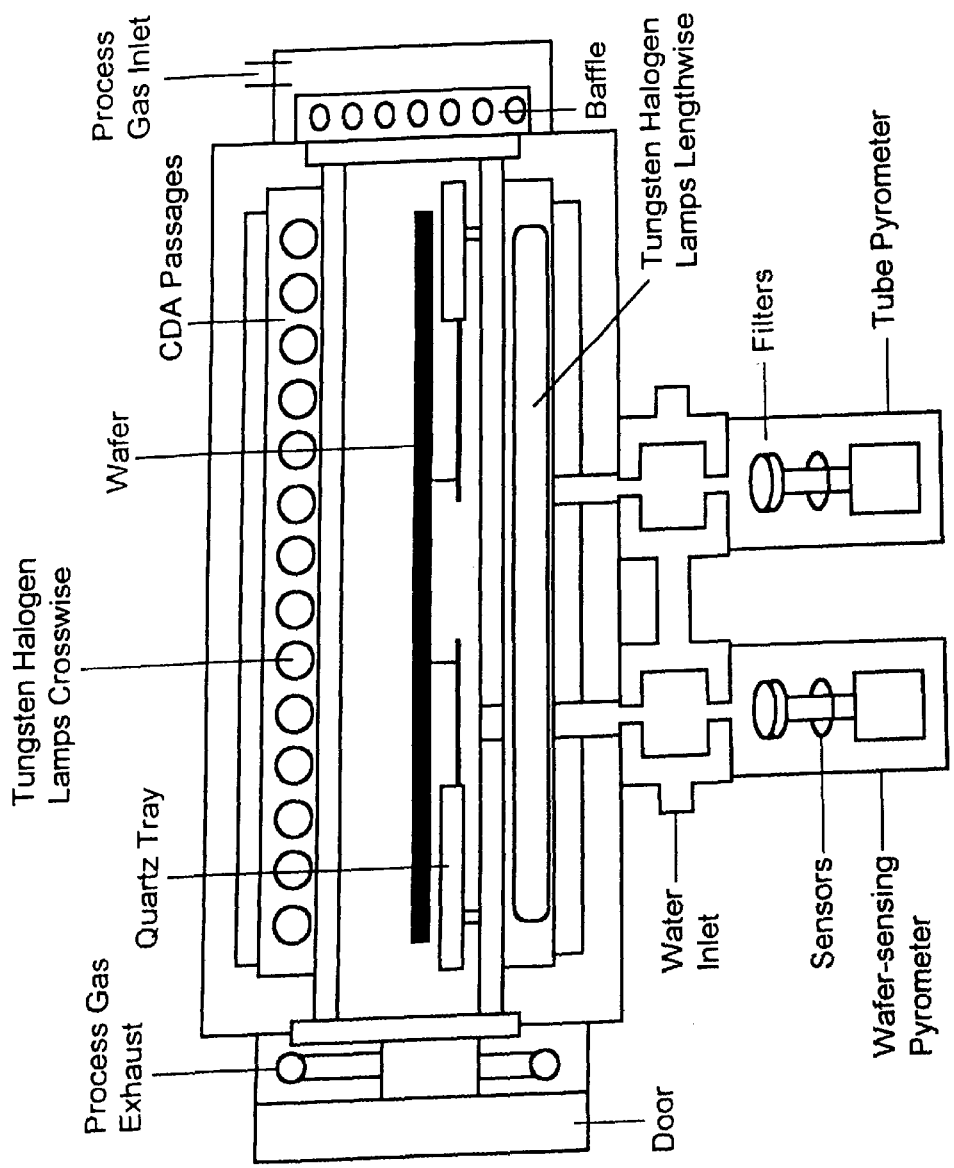
FIG. 2 shows a side cross sectional view of a conventional lamp RTP system.
Figure 3:
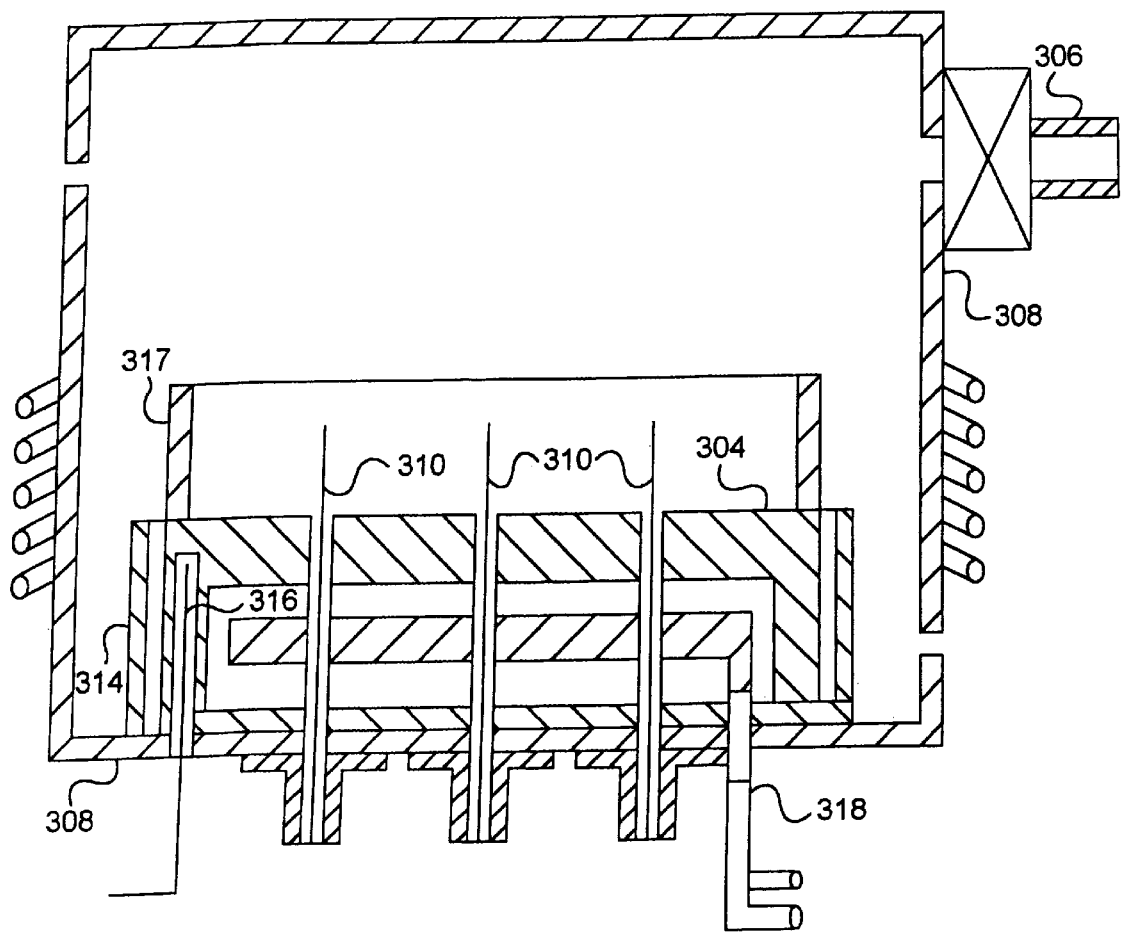
FIG. 3 is a side cross sectional view of a conventional heated plate rapid thermal processor.
Figure 4:
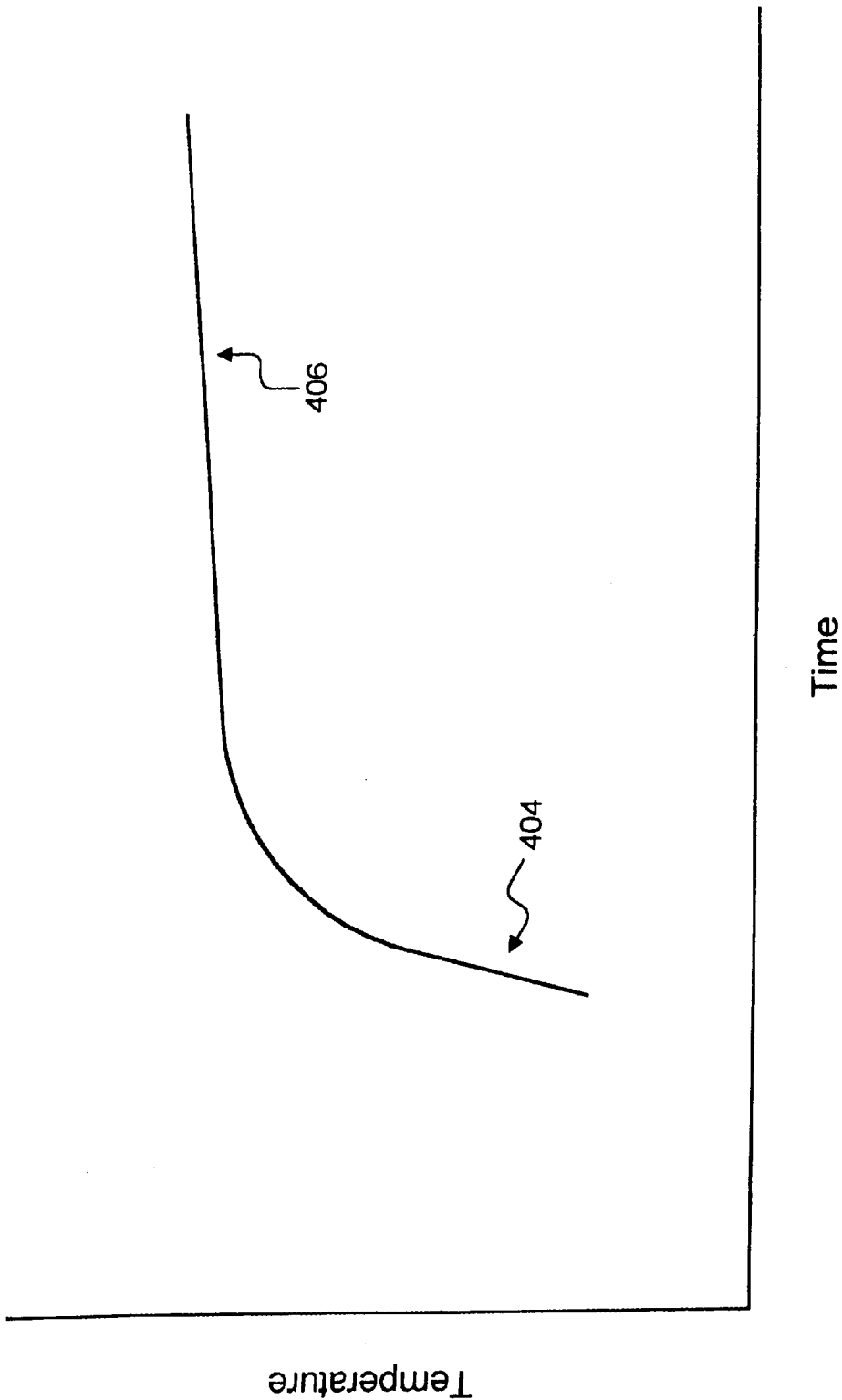
FIG. 4 is a graph of the temperature of a wafer over time as it is heated by a constant temperature heat source at a constant pressure.
Figure 5:
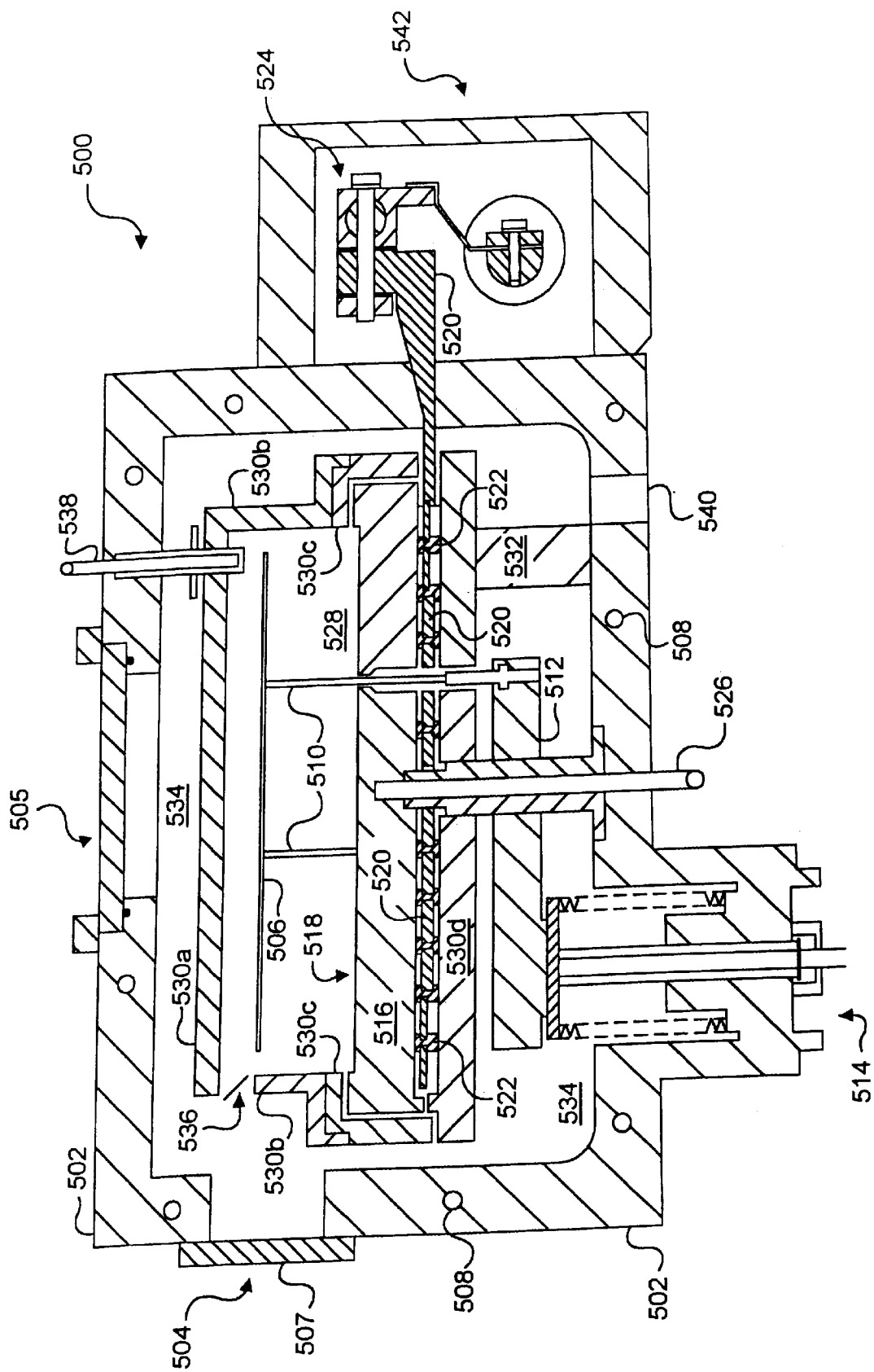
FIG. 5 is a side cross sectional view of a thermal processing chamber according to a first embodiment of the present invention.
Figure 6A:
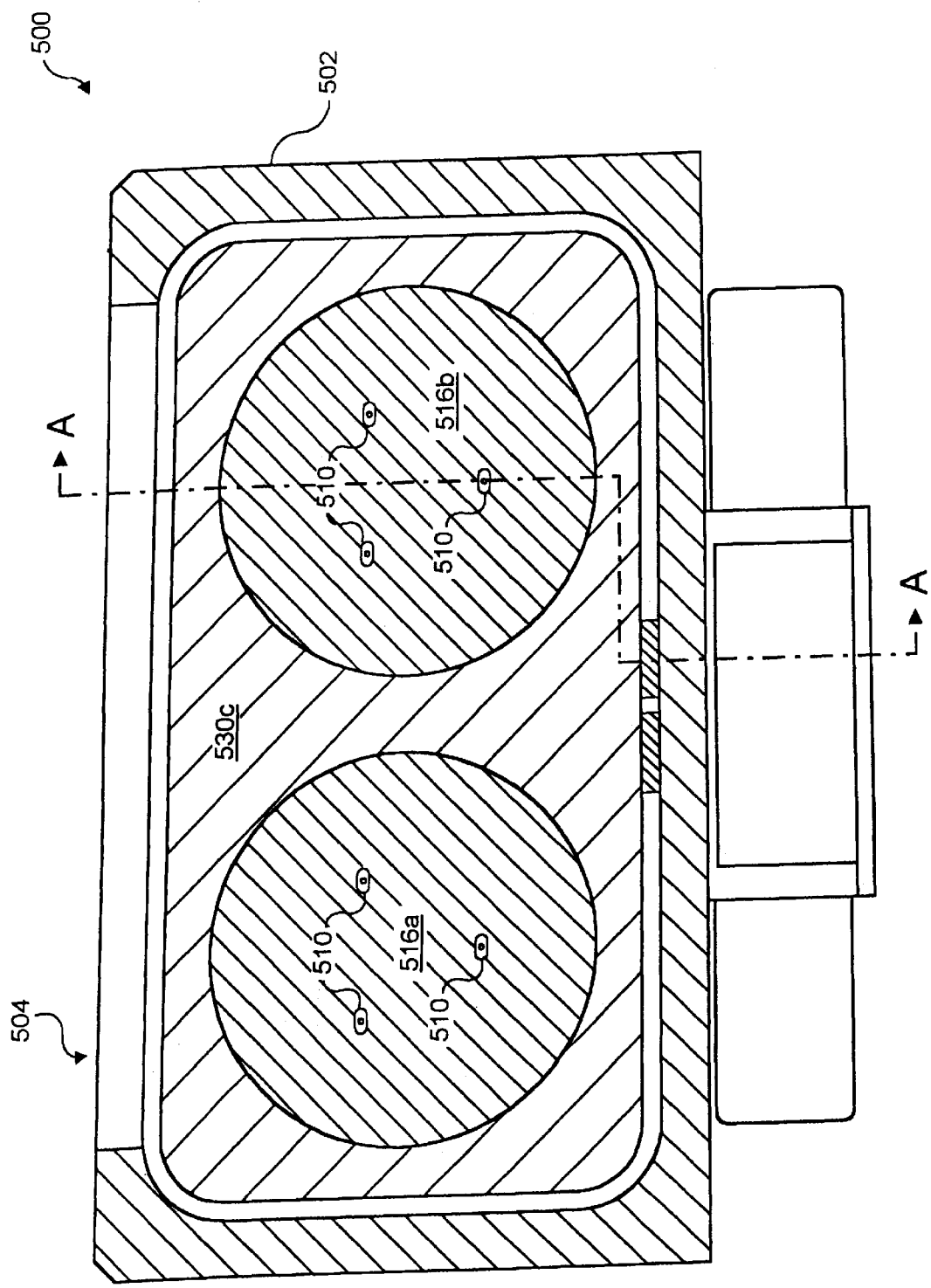
FIG. 6A is a top cross sectional view of a thermal processing chamber according to the first embodiment with insulating hoods removed.
Figure 6B:
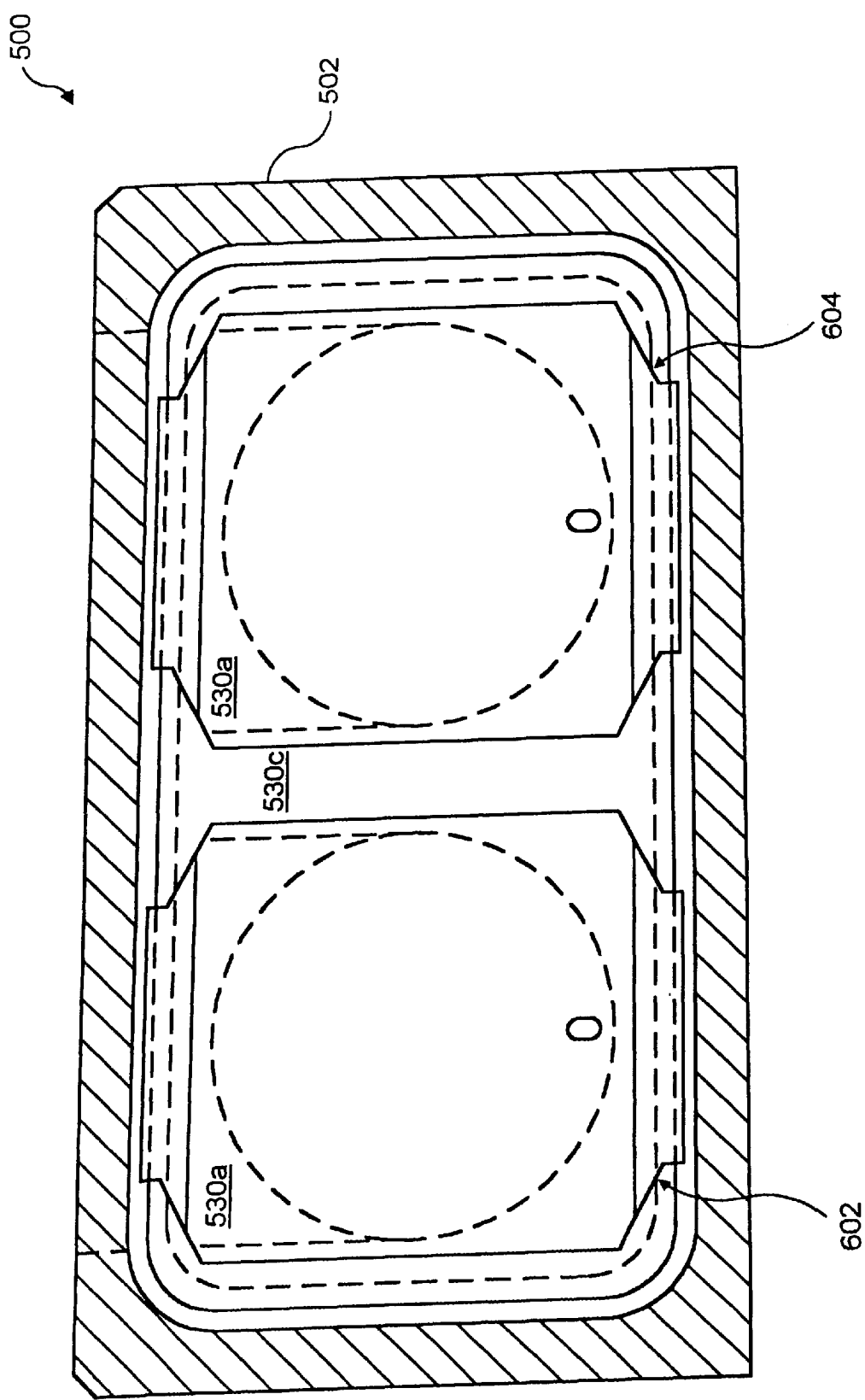
FIG. 6B is a top cross sectional view of a thermal processing chamber according to the first embodiment with insulating hoods in place.

FIG. 5 is a side cross sectional view of a thermal processing chamber, generally indicated at 500, according to the first embodiment of the present invention. FIG. 6A is a top cross sectional view of the thermal processing chamber according to the first embodiment with insulating hoods removed, and FIG. 6B is a top cross sectional view of the thermal processing chamber according to the first embodiment with insulating hoods in place. The first embodiment of the present invention is preferably designed for use in conjunction with the Aspen™ wafer handling system available from Mattson Technology Inc., assignee of record of the present invention. The Aspen™ system allows two wafers to be handled at a time and, as indicated in FIG. 6A, the chamber according to the first embodiment has two wafer processing stations. The dashed line A in FIG. 6A indicates the location of the side cross section of FIG. 5 which shows one of these processing stations. Aspects of the present invention allow a single stable heat source to be used for uniformly processing two wafers at a time. As will be described further below, titanium silicide anneal may be carried out in the chamber of the first embodiment with a throughput of approximately ninety (90) wafers per hour and a process uniformity better than typical multi-zone lamp systems. Of course, a wide variety of processes may be carried out and alternative embodiments may be optimized for processing a single wafer at a time. Techniques described below may also be applied to allow uniform processing of more than two wafers at a time.

Referring to FIG. 5, the chamber walls 502 in the first embodiment form an outer port 504 through which a semiconductor substrate, such as wafer 506, may be introduced into the chamber 500. A conventional load lock mechanism (such as provided by the Aspen™ system) may be used for inserting and removing wafer 506 through outer port 504. After the wafer has been loaded into chamber 500, a plate 507 is used to cover outer port 504. In addition, a viewing window 505 may be provided for, among other things, end point detection, in situ process monitoring and wafer top surface temperature measurement. If a window is used for these purposes, a small hole or clear section must be provided through any internal chamber surfaces, such as insulating walls, to allow the wafer to be viewed. When a window is not used, a nontransmissive plate may be used to cover the viewing port for improved insulation.

Chamber walls 502 are relatively cold, preferably being maintained at an average temperature less than one hundred degrees Celsius (100° C.). In the first embodiment, chamber walls 502 are aluminum and are cooled by cooling channels 508. Water or another cooling media may be pumped through cooling channels 508 to cool the aluminum chamber walls 502.

After the wafer is introduced into the chamber, it is placed upon narrow pins 510 which comprise silicon carbide or ceramic in the first embodiment. The pins are mounted on a pin support plate 512 that may be raised and lowered by an elevational mechanism 514, such as a pneumatic or electromechanical lift with a vacuum sealed bellows. After the wafer is loaded into the chamber and placed on pins 510, the elevational mechanism 514 is lowered to place wafer 506 close to or onto a heated block 516 for thermal processing.

The heated block preferably has a large thermal mass that provides a stable and repeatable heat source for heating wafer 506. Preferably, heated block 516 provides a heating surface 518 within the chamber that is substantially parallel to the wafer to allow heat transfer across the entire backside surface area of the wafer. Heated block 516 comprises a material that will not contaminate wafer 506 even when the wafer is placed in contact with the heated block at high temperatures (greater than 500° C.) and low pressures (less than 100 Torr). In the first embodiment, heated block 516 comprises silicon carbide coated graphite, although other materials that will not react with the wafer at processing temperatures such as silicon carbide or quartz may be used as well. A material with high thermal conductivity is preferred to allow heat to uniformly dissipate through the block. Insulating techniques described below are used to prevent sharp temperature gradients from forming in the heated block due to heat losses at the edges of the block.

The heated block is approximately one (1) inch thick in the first embodiment and provides a thermal mass substantially larger than the wafer which is only about thirty five thousandths (0.035) of an inch thick. It is preferred that heated block 516 be at least ten times thicker than the wafer that is being processed. This provides a stable temperature heat source for thermally processing wafer 506.

In the first embodiment, a single heated block 516 extends across most of the chamber and provides a generally rectangular heating surface large enough to process two wafers at a time as shown in FIG. 6A The exposed regions 516a and 516b in FIG. 6A are portions of the same heated block. Using a single heated block provides a simplified and cost effective design. However, the heated block cannot be easily rotated to rotate the wafers during processing. Wafer rotation is often desired to enhance uniformity in semiconductor processing. The thermal processing chamber of the first embodiment provides exceptional processing uniformity even with a simplified non-rotating design. In alternative embodiments, a separate rotating heating plate may be provided for each wafer to further enhance uniformity. The wafers could also be held slightly above the heated plate and rotated on pins. However, the chamber according to the first embodiment provides excellent uniformity without rotation, so a simplified and cost effective design is preferred.

The heated block is heated by a resistive heater 520 positioned below the heated block. The resistive heater preferably comprises silicon carbide coated graphite although other materials may also be used. The design of the resistive heater is described in detail below with reference to FIG. 12. Heater support pins 522 space the resistive heater from heated block 516 by a short distance (approximately 0.125 of an inch). A power source (not shown) is connected to the heater by a heater mounting mechanism 524 in a separate heater mounting chamber 542 described in detail below with reference to FIGS. 13A and 13B. Current is driven through resistive heater 520 to heat the heated block 516 which in turn acts as a stable heat source for wafer 506. The power applied to the resistive heater may be adjusted to control the temperature of the heated block. A thermocouple 526 or other temperature sensor may be used to measure the temperature of the heated block. An optical pyrometer or thermocouple (not shown) may also be used to measure the wafer temperature directly. The temperature sensors send signals indicative of the temperature of the heated block and/or wafer to a conventional temperature control system (not shown). The temperature control system then causes a transformer or other power source to apply an appropriate amount of power to the resistive heater to achieve the desired processing temperature. Typically temperatures between five hundred degrees Celsius (500° C.) and one thousand degrees Celsius (1000° C.) are used for thermal processing in the chamber according to the first embodiment.

Of course other mechanisms may be used to provide a stable heat source. For instance, an RF coil could be used to induce a current in a conductive plate within the chamber or lamps could be used to heat the backside of a conductive block. However, the resistive heater and heated block of the first embodiment provide an exceptionally stable and durable heat source and are preferred.

In order to reduce heat loss and enhance uniformity, heated block 516 and wafer 506 are enclosed within an insulated heating chamber 528. Heating chamber 528 is formed by insulating walls 530*a–d* spaced apart from heater 520, heated block 516 and wafer 506. The insulating walls 530*a–d* preferably comprise a material that has a low thermal conductivity. In addition, insulating walls 530*a–d* are preferably highly reflective and substantially nontransmissive to thermal radiation (particularly in the visible and infrared regions). Thus, insulating walls 530*a–d* substantially prevent heat transfer by direct radiation from within heating chamber 528 to cold chamber walls 502. In the first embodiment, insulating walls 530*a–d* comprise opaque quartz with a thermal conductivity of approximately three and one half Watts per centimeter Kelvin (3.5 W/cmK). Opaque quartz is highly preferred in the first embodiment because it is durable and inert in virtually all processes, has a high reflectivity and low conductivity, and may be used to form an insulating wall using a single intrinsic piece of material. Opaque Silica Glass OP-1 from Nippon Silica Glass U.S.A., Inc. is an exemplary opaque quartz that may be used in the first embodiment. In contrast to transparent-quartz, opaque quartz is white with a nearly ideal opaque appearance. This is due to the special structure of the material which has a well-controlled distribution of micropores in the otherwise dense matrix, scattering light and thermal radiation in a very efficient and homogeneous way. Thus, the direct transmission of radiation is nearly completely suppressed (less than 1% transmission across wavelengths from 200 to 5000 nm for 3 mm path length). The surface of the opaque quartz is preferably treated to inhibit flaking and the release of particulates. This is accomplished in the first embodiment by exposing the surfaces of the opaque quartz to high temperatures which glaze the surfaces. This forms a shallow layer (approximately 1 mm deep) of clear durable quartz on the exterior surfaces of the insulating walls which acts as a protective coating.

Of course, other heat resistant insulating materials, such as alumina and silicon carbide, could be used for the insulating walls. In addition, the insulating walls may be formed from a transmissive material such as clear quartz coated with a reflective material such as alumina, silicon carbide, or silicon nitride. However, these alternatives tend to be less durable than glazed opaque quartz, often flake and spall, and may interfere with the chemistry of some processes.

It is preferred that the material used for the insulating walls have a thermal conductivity less than five Watts per centimeter Kelvin (5 W/cmK) in the first embodiment although it will be readily understood that the thickness, thermal conductivity, and transmission of the material may be varied to achieve a desired level of insulation. Additional insulating walls may also be positioned between the heating chamber and chamber walls to improve insulation. In particular, the heating chamber may be enclosed within multiple insulating housings with vacuum regions formed between the housings.

As shown in FIG. 5, four opaque quartz insulating walls—a top 530*a*, side 530*b*, base 530*c*, and bottom 530*d*—are used to form heating chamber 528 in the first embodiment. The top 530*a* and side 530*b* insulating walls may be formed from a single piece of opaque quartz which provides an insulating hood that may be placed over each wafer processing station as indicated in FIG. 6B. As shown in FIG. 5, the base 530*c* and bottom 530*d* insulating walls are closely spaced to the heated block 516 and resistive heater 520. In the first embodiment, the base 530*c* and bottom 530*d* insulating walls substantially encapsulate the heat source except for exposed circular regions of the heating surface which are shaped to receive the wafers as shown at 516*a* and 516*b* in FIG. 6A. This helps channel the heat flux from the heat source through a circular region normal to the wafer surface and reduces lateral thermal gradients. In addition, the beating surface extends radially from the circular region underneath the base insulating wall 530*c*. This helps isolate the wafer from any temperature drop off at the edge of the heated block. As shown in FIG. 5, the heated block forms shallow pockets for receiving the wafers in the circular regions that are left exposed by the base insulating wall 530*c*. The pockets are between one sixteenth (0.0625) and one eighth (0.125) of an inch deep in the first embodiment and may be flat, slightly concave with the center of the pocket being slightly lower (approximately 0.003 inches) than the perimeter of the pocket, or stepped with the center recessed relative to a ledge formed about the outer radius of the pocket. Recessed pockets help retain heat at the edges of the wafer and the pocket shape may affect temperature uniformity across the wafer surface. Nevertheless, outstanding process uniformities have been achieved at six hundred degrees Celsius (600° C.) and eight hundred degrees Celsius (800° C.) using both flat and recessed pocket designs.

The top cross section of FIG. 6A shows the chamber of the first embodiment without the top 530*a* and side insulating wall 530*b*. FIG. 6B shows a top view of the chamber with insulating hoods (which provide the top 530*a* and side 530*b* insulating walls) placed over each wafer processing station as indicated at 602 and 604. As shown in FIG. 6B, a separate insulating hood is placed over each wafer pocket although a single hood enclosing both pockets may be used as well. Other configurations, such as cylindrical hoods around each wafer pocket, may also be used.

Preferably the insulating walls have a thickness in the range of from twenty five hundredths (0.25) to one (1) inch although the thickness may be varied depending upon the thermal conductivity and transmission of the material. In the first embodiment, the top, side, and base insulating walls are approximately three hundred seventy five thousandths (0.375) of an inch thick and the bottom insulating wall (which is close to the graphite heater) is approximately six hundred twenty five thousandths (0.625) of an inch thick. The bottom insulating wall 530d is spaced from the chamber walls 502 by support leg 532. The support leg 532 also comprises an insulating material such as opaque quartz to minimize conductive heat transfer from the bottom insulating wall 530d to the chamber walls 502. While several support legs may be used, it is desirable to minimize the cross section of the thermally conductive path formed between the bottom insulating wall 530d and the bottom chamber wall by any support legs. In the first embodiment, the support leg 532 has a relatively small cross section (substantially less than 10% of the surface area of the bottom insulating wall) to prevent a large conductive path from being formed between the insulating walls and chamber walls.

The insulating walls 530a–d substantially enclose the heating chamber 528 and form an outer insulating chamber 534 between the insulating walls and the cold chamber walls. The insulating walls form an inner port 536 between the heating chamber 528 and insulating chamber 534 to allow a wafer to be inserted into the heating chamber. A piece of insulating material may be used to cover the inner port 536 during processing to provide additional insulation. Generally, heat is transferred in the first embodiment from the heated plate 516, across the heating chamber 528 to the insulating walls 530a–d, through the insulating walls 530a–d and across the insulating chamber 534 to the cold chamber walls 502. Of course, some heat may be transferred through support leg 532 by conduction and through inner port 536 by direct radiation (unless an opaque cover is used). However, a substantial majority (more than 90%) of the radiation from the heated block 516 is intercepted by the insulating walls 530a–d and only a small portion of the bottom insulating wall (less than 10%) is in contact with the support leg. Thus, the rate of heat transfer in the first embodiment is substantially dependent upon the thermal resistance across the heating chamber 528, through the insulating walls 530a–d, and across the insulating chamber 534.

The thermal resistance across the heating chamber and insulating chamber can be adjusted by adjusting the processing pressure. Tube 538 provides a gas inlet and gas exhaust port 540 provides a gas outlet. The tube 538 is connected to a conventional gas source (not shown) and gas exhaust port 540 is connected to a conventional vacuum pump (not shown) which allows the pressure in the chamber to be controlled. In the first embodiment, pressures from seven hundred sixty (760) Torr (atmospheric) down to less than one tenth (0.1) of a Torr may be achieved. As will be described further below, pressures less than one hundred (100) Torr, and in particular pressures between two (2) Torr and fifty (50) Torr, are preferred in the first embodiment.

The low pressure, insulating walls, and other thermal properties (described further below) allow a very compact chamber design to be used with a high level of uniformity. In the first embodiment, the heated block 516 is approximately ten (10) inches wide which is only slightly wider than the wafer and its edges may be within one (1) inch of the cold chamber walls. The base insulating wall 530c is approximately one hundred twenty five thousandths (0.125) of an inch from the edge of heated block 516 and the distance from the base insulating wall to the chamber wall (across the insulating chamber 534) is less than half an inch. Thus, the width of the heated block is more than eighty percent (80%) of the interior width of the processing chamber. In addition, the heated block occupies more than ten percent (10%) of the interior volume of the processing chamber. Processing temperature uniformity may be achieved using this compact design even though the heated block may be heated in excess of one thousand degrees Celsius (1000° C.) and the chamber walls may be cooled to an average temperature of less than one hundred degrees Celsius (100° C.) with water or other cooling media. However, in order to maintain an acceptable level of uniformity, the chamber dimensions and materials and the processing parameters in the first embodiment must be carefully selected to control heat transfer across heating chamber 528, through insulating walls 530a–d, and across insulating chamber 534. In order to control heat transfer in the first embodiment, it is important to understand the mechanisms of heat transfer in these three regions.

Heat may be transferred across the heating chamber and insulating chamber by conduction, radiation, and convection. Heat transfer through the insulating wall occurs primarily by conduction—the insulating wall is opaque so there is little if any radiative heat transfer, and since the insulating wall is solid, there are no convective currents. The basic mechanisms of conduction, radiation, and convection, will now be discussed with reference to the equations in Table 1 below. For further information see, e.g., F. Kreith, Principles of Heat Transfer (3d. ed 1973).

TABLE 1

(1) $q = \dfrac{k \cdot \Delta T}{L}$ (2) $Gr = \dfrac{g \cdot \rho^2 \cdot \beta \cdot L^3 \cdot \Delta T}{\mu^2}$ (3) $q = \dfrac{\sigma(T_h^4 - T_c^4)}{[((1/\epsilon_h) - 1) + 1 + ((1/\epsilon_s) - 1)] \cdot (T_h - T_c)}$ In conductive heat transfer energy exchange takes place from a region of high temperature to a region of low temperature by the kinetic motion or direct impact of molecules, as in the case of a gas at rest, and by the drift of electrons in solids. Equation 1 in Table 1 describes the conductive heat transfer between two planar surfaces where q is the rate of heat transfer, $\Delta T$ is the difference in temperature between the two surfaces, L is the distance between the two surfaces, and k is the thermal conductivity of the material through which the heat is transferred. The heat transfer by conduction is proportional to $\Delta T$ and is inversely proportional to L. In addition, for a gas, the thermal conductive resistance can be increased at very low pressure (the rarified gas regime) due to the increased mean free path for the gas molecules. Thus, heat transfer by conduction is reduced at very low pressures.

Natural convection involves heat transfer when a hot surface is below a cold surface and takes place through fluid currents. Heat is transferred to a portion of the fluid near the hot surface. This heated fluid expands thereby creating a lower density buoyant cell. This heated buoyant cell moves up away from the hot surface and is displaced by a cooler more dense cell. This exchange or current of hot and cold cells enhances the heat transfer. Natural convection is a complex mode of heat transfer that is not easily calculated, although it may be estimated using a ratio called Grashof's number. A low Grashof's number (less than 10,000) generally indicates low convective heat transfer while a high Grashof's number indicates high convective heat transfer. Equation 2 in Table 1 is the equation for Grashof's number where g is the acceleration of gravity (−9.8 m/s²), $\rho$ is the density of the fluid (which is proportional to pressure and inversely proportional to temperature for a gas), $\beta$ is the compressibility of the fluid (which is inversely proportional to temperature for a gas), L is the distance between the surfaces, $\Delta T$ is the temperature difference between the surfaces, and $\mu$ is the viscosity of the fluid. Thus, heat transfer by natural convection is proportional to $\Delta T$, the pressure squared (due to the $\rho^2$ term), and the distance cubed ($L^3$). Thus, convective heat transfer is substantially eliminated at low pressures across short distances.

Heat transfer by radiation is the transfer of energy by electromagnetic waves radiated between two surfaces. An equation for heat transfer by radiation between two parallel plates is set forth as equation 3 in Table 1 where $\sigma$ is the Stefan-Boltzmann constant ($5.6697 \times 10\text{-}8 \text{ W}/(m^2 K^4)$), $T_h$ is the temperature of the hotter surface, $T_c$ is the temperature of the cooler surface, $\epsilon_h$ is the emissivity of the hotter surface, and $\epsilon_c$ is the emissivity of the cooler surface. Radiation is proportional to the difference between $T_h^4$ and $T_c^4$.

The thermal processing chamber of the first embodiment provides enhanced processing uniformity across a wide range of temperatures and improved process repeatability by minimizing heat transfer from heated block 516 and wafer 506 to the cold chamber walls 502 while providing a high rate of heat transfer from the heating surface 518 to the wafer 506. In addition, the relative distances between wafer 506 and heating surface 518, the heating surface 518 and insulating walls 530, and insulating walls 530 and cold chamber walls 502 are carefully balanced with the processing pressure to achieve improved uniformity and repeatability.

It is desirable to achieve a high rate of heat transfer from heating surface 518 to wafer 506 in the first embodiment such that the wafer is rapidly heated to a temperature approximately equal to the temperature of the heating surface. This allows the heating surface to provide a stable and repeatable heating source for the wafer. In addition, the temperature of the wafer can be approximated using a thermocouple embedded in the heating surface. Some conventional approaches for improving the heat transfer from a heater to a wafer involve spacing the wafer from the heater and providing a gas to induce convective currents between the heater and the wafer. However, it is also desirable in the first embodiment to minimize heat transfer from the edges of the wafer and heating surface to cold chamber walls to avoid nonuniformities in wafer temperature. In this respect, convective currents are distinctly undesirable. Further, it is desirable to minimize overall heat loss from the chamber for improved energy efficiency, while still providing a sufficient rate of thermal transfer to the wafer.

It is also desirable to provide a stable heating environment with a heating surface having a large thermal mass. In contrast to conventional diffusion furnaces, the thermal environment should not be greatly disturbed by the introduction of relatively cool wafers. Therefore, initially there should be a high thermal resistance between the wafer and the surrounding environment. Thereafter, it is desirable to reduce the thermal resistance between the heating surface and the wafer to provide substantially uniform heating across the wafer surface. At the same time, a high thermal resistance should be maintained at the edges of the wafer and the edges of the heating surface to avoid sharp thermal gradients and temperature nonuniformities. While active heaters, heat shields and insulation have been used at the edges of wafers and hot plates, conventional approaches are often undesirable since the heat transfer varies greatly across temperature ranges leading to under-heating of the wafer edges at some temperatures and overheating at others.

The chamber dimensions, chamber materials and processing parameters in the first embodiment are selected to overcome many of the problems associated with conventional thermal processors. In particular, the conditions set forth in Table 2 are satisfied in the first embodiment such that desired thermal characteristics are attained.

TABLE 2

Figure 7:
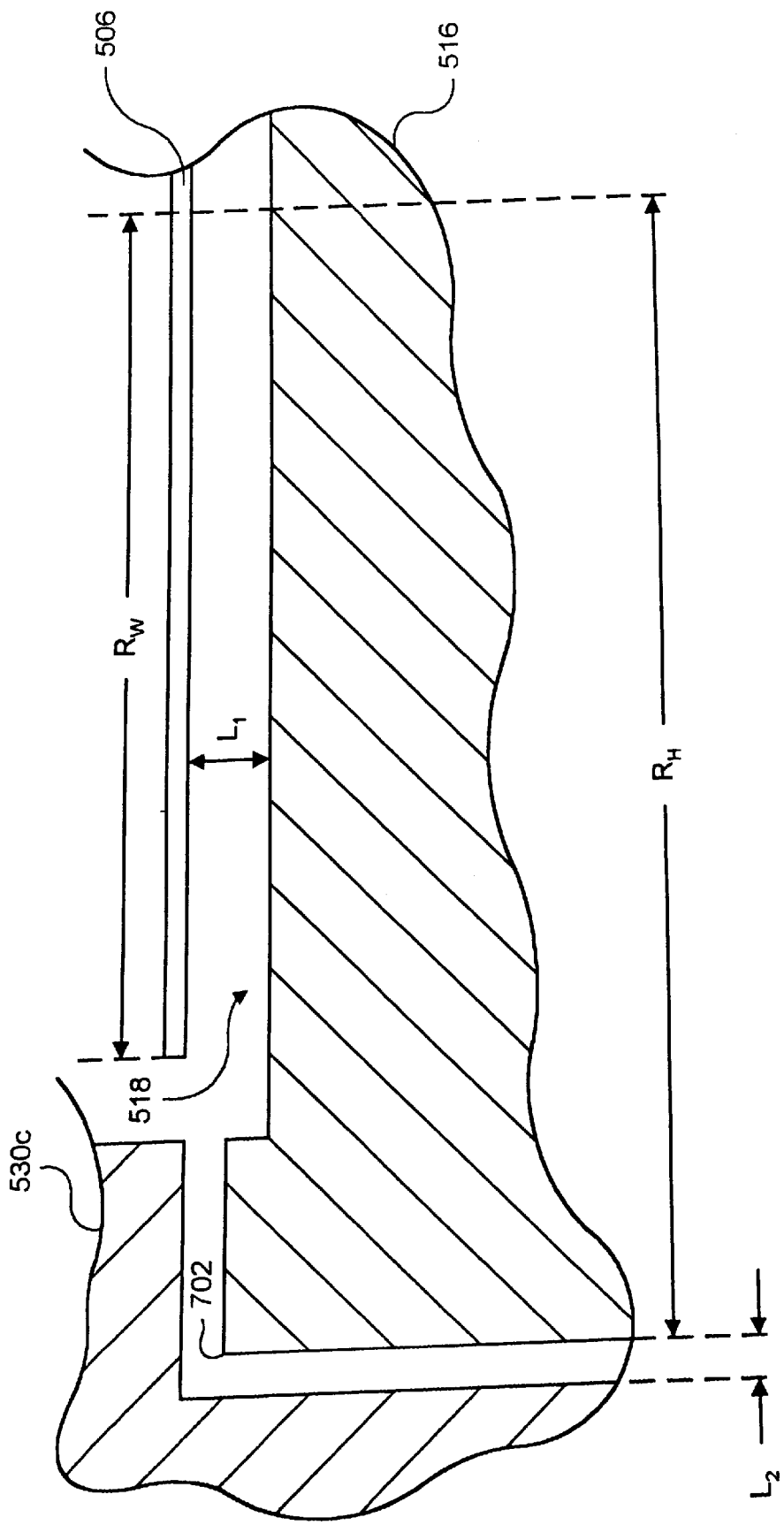
FIG. 7 is a side cross sectional view of a portion of the thermal processing chamber shown in FIG. 5.

(1) $\dfrac{L_2}{L_1} > \dfrac{25 R_W}{R_H}$ (2) $\Delta T_{AV} < \dfrac{T_H}{2}$ (3) $\Delta T_{Edge} < \dfrac{T_H}{5}$ Conductive heat transfer from the heated block 516 to the chamber walls 502 in the first embodiment is substantially reduced by adjusting the processing pressure and distances between the heated block and surrounding chamber surfaces. However, it is desirable to have significant conductive heat transfer from the heating surface 518 to the wafer 506. FIG. 7 illustrates a portion of the chamber of FIG. 5 and shows the arrangement of heated block 516, wafer 506 and base insulating wall 530c. $L_1$ indicates the distance from the heating surface to the wafer and $L_2$ indicates the average distance from the side edge of the heated block to the nearest heat receiving surface in the chamber (which in the first embodiment is base insulating wall 530c). In order to reduce conductive heat loss at the edge of the heated block and to reduce heat loss by natural convection, it is desirable to increase $L_2$ and decrease pressure. However, in order to conductively heat wafer 506 it is desirable to increase pressure and decrease $L_1$. Further, to the extent that there are gradients at the edge of heated block 516, it is desirable to have the radius of the wafer, $R_W$, be smaller than the average distance from the center of the wafer to the edge of the heated block, $R_H$ to isolate the wafer from the gradients. These factors are balanced in the first embodiment according to the first condition in Table 2 where $L_2$ is the average distance from the edge of the heated block to the nearest chamber surface receiving heat, $L_1$ is the distance between the wafer and the heating surface, $R_W$ is the radius of the wafer, and $R_H$ is the average distance from the center of the wafer to the nearest edge of the heated block.

Generally, if this condition is satisfied, $L_2$ will be greater than $L_1$ so there will be a higher thermal resistance to conduction between the heated block and surrounding chamber surfaces than between the heating surface and the wafer. At higher pressures $L_2$ must be larger since convective heat loss from the heated block will be larger. However, $R_W/R_H$ can be decreased to some extent to isolate the wafer from any thermal gradients at the edge of the heated block. In the first embodiment $L_2$ is approximately one hundred twenty five thousandths (0.125) of an inch and $L_1$ is less than five thousandths (0.005) of an inch (preferably wafer 506 is placed substantially in contact with heated block 516). Thus, $L_2$ is much greater than $L_1$ and $L_2/L_1$ is at least twenty five (25). $R_W$ is approximately four (4) inches and $R_H$ is at least 5 inches (the smallest radius from the center of the wafer to the edge of the heated plate is approximately 5 inches and due to the elongated shape of the heated block, the average radius $R_H$ would be larger). Therefore, $R_W/R_H$ is at least eight tenths (0.8). Thus, 25 $R_W/R_H$ is less than twenty (20)

which is less than the ratio of $L_2/L_1$ (which is more than 25) in accordance with the first condition set forth in Table 2. A very small $L_1$ (less than 0.01 inch) is preferred in the first embodiment since the above condition may be satisfied with a smaller $L_2$ and $R_H$ and therefore a compact chamber design may be used. Proximity heating is avoided in the compact chamber design of the first embodiment to avoid temperature nonuniformities induced by conductive heat losses. While conductive heat losses are limited in the first embodiment, conduction does play an important role in heating the wafer.

Convective heat transfer, on the other hand, is substantially eliminated in the first embodiment since vertical chimney effects along the edges of the heated block might otherwise induce unacceptable thermal gradients. In addition, by substantially eliminating convection the energy efficiency of the chamber is greatly enhanced. Further, since the wafer is preferably positioned very close to the heating surface, convection does not play a major role in heating the wafer. Therefore, eliminating convective heat losses improves the efficiency of the system without substantially degrading wafer heating. Convective heat transfer is substantially eliminated in the first embodiment by lowering the processing pressure. As pressure is lowered from atmospheric pressure, convective heat transfer is reduced. At some point, convective heat transfer is substantially eliminated and further reduction in pressure does not substantially reduce heat transfer (unless the pressure is reduced to a very low value within the rarified gas regime which reduces conductive heat transfer). The pressure in the first embodiment is maintained below the level at which convective heat transfer is substantially eliminated. Preferably, the pressure is less than eighty (80) Torr with pressures of fifty (50) Torr, ten (10) Torr, and two (2) Torr typically being used in processing as will be described further below.

At very low pressures, heat transfer is further reduced. In the first embodiment, this phenomena reduces heat transfer between the heated plate and wafer at pressures less than about ten (10) Torr. It is believed that this phenomenon is based upon the thermal conductive properties of a gas between two closely spaced surfaces where the mean free path of the molecules in the gas is on the order of the distance between the surfaces (the rarified gas regime). At very low pressures (when the mean free path is the largest) and at small distances, it is believed that the equation for conductive heat transfer (shown in Table 1) must be modified to reflect the fact that the mean free path of molecules in the gas is constrained by the closely spaced surfaces.

It is believed that the first equation in Table 1 must be modified to explain the variance in the heating rate across low pressures when the surfaces are closely spaced. In particular, it is believed that an effective distance, Lff, must be substituted for the geometric distance, L, between the surfaces (which in this case is the distance between the wafer and the heating surface). The effective distance, $L_{eff}$, is equal to the geometric distance, L, plus twice the mean free path of molecules in the gas, $2\lambda$. Since conductive heat transfer is inversely proportional to $L_{eff}$, changing the mean free path by altering pressure can drastically change the rate of conductive heating when the mean free path is significant relative to the geometric distance, L. This occurs at low pressures (generally less than 50 Torr and less than ten (10) Torr in the first embodiment) when the wafer is placed very near (and preferably in contact with) the heating surface.

Figure 9:
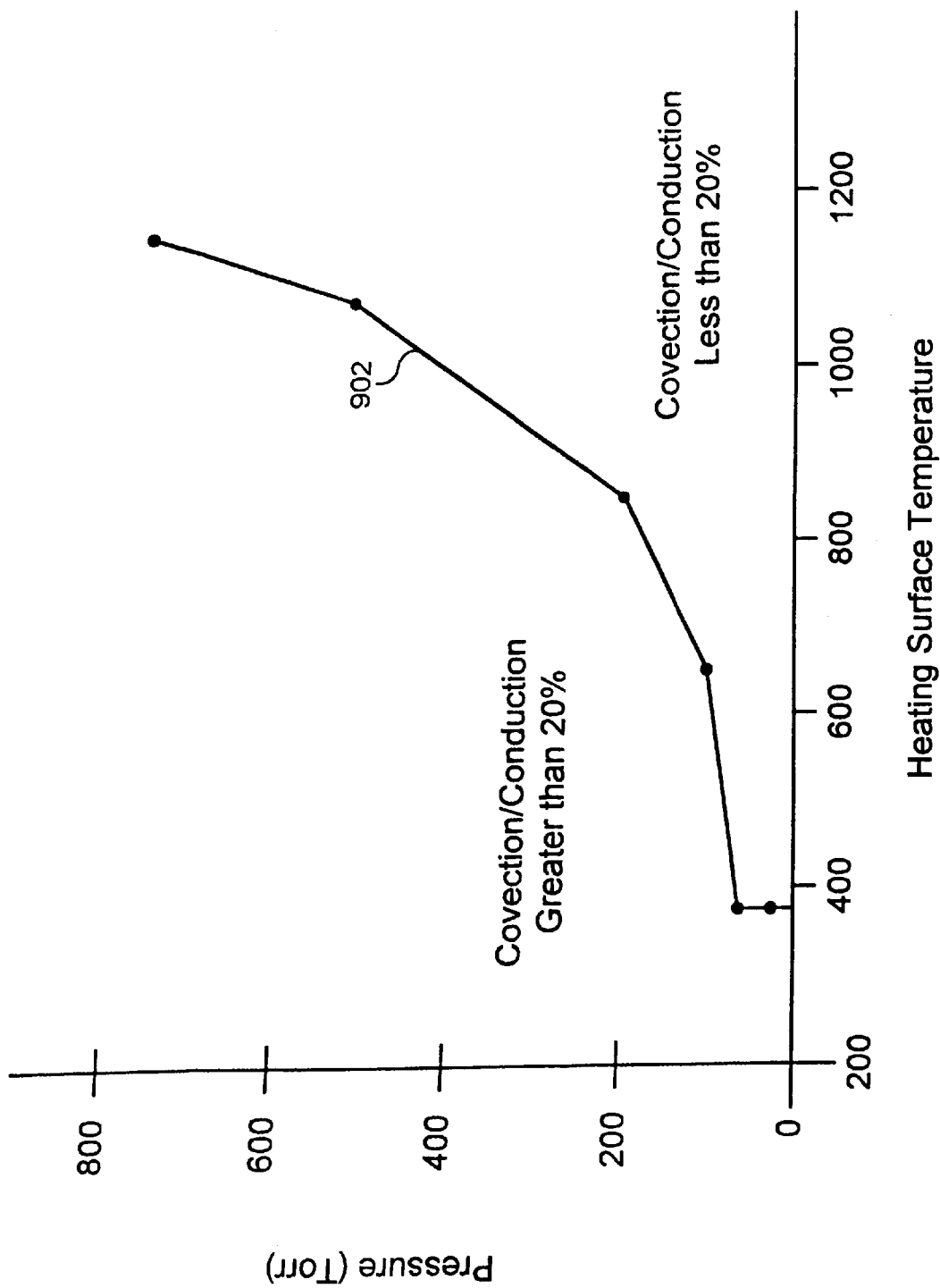
FIG. 9 is a graph illustrating the relationship between heat transfer by radiation, conduction, and convection at various temperatures and pressures.

Therefore, both conduction and convection are reduced in the first embodiment by reducing chamber pressure. Preferably, conduction and convection account for less than twenty percent (20%) of the heat transfer from the heated block to the insulating walls. The effect of pressure on heat transfer may be illustrated using a model of heat transfer between two parallel surfaces. The first surface is assumed to be a graphite block at six hundred degrees Celsius (600° C.) or eight hundred degrees Celsius (800° C.) and the second surface is assumed to be a conductive wall at fifty degrees Celsius (50° C.). The material properties and dimensions were held constant, and heat transfer by radiation, convection and conduction was estimated at various pressures. It will be understood that this example is merely illustrative of the effects of pressure on heat transfer and is not representative of actual heat transfer in the first embodiment. FIG. 8 is a table showing the estimated percentages of heat transfer due to radiation, convection and conduction at pressures of two (2) Torr, two hundred (200) Torr, and seven hundred sixty (760) Torr with graphite block temperatures of six hundred degrees Celsius (600° C.) and eight hundred degrees Celsius (800° C.). The total estimated heat flux and Biot Number are also shown. The Biot Number is equal to (h·L)/k where h is the convective heat transfer coefficient (which decreases with pressure), L is the thickness of the graphite block, and k is the thermal conductivity of the block. A low Biot Number indicates good temperature uniformity across the block. Thus, a thermally conductive block held at low pressure provides the most uniform heating source. Thus, for uniform wafer heating it is desirable to lower pressure in the first embodiment so long as a sufficient heat flux to the wafer is maintained. FIG. 9 is a graph illustrating the pressure at which conduction and convection are estimated to account for less than twenty percent (20%) of heat transfer. For the first embodiment, the pressure in the heating chamber is preferably maintained below the level indicated by line 902 in FIG. 9 during processing.

As a result, radiation is the primary mode of heat transfer to the insulating walls in the first embodiment. Radiative heat transfer from the heated block to the insulating walls is proportional to the temperature of the heated block raised to the fourth power, $T_H^4$, minus the temperature of the insulating walls raised to the fourth power, $T_i^4$. Due to the exponential dependence on temperature, it is desirable to reduce the average temperature difference $\Delta T_{AV}$ between the heated block and radiation receiving chamber surfaces (in this case, the insulating walls). As shown in the second condition in Table 2, it is desirable to limit $\Delta T_{AV}$ to less than one half the average temperature of the heated block ($T_H/2$) to limit radiative losses and potential induced thermal gradients. $\Delta T_{AV}$ can be defined more generally as the average temperature of a heating surface used to heat a wafer minus the average temperature of cooler chamber surfaces that receive direct radiation from the heating surface. $\Delta T_{AV}$ can be measured experimentally using thermocouples to sense the temperatures across the heating surface and radiation receiving surfaces.

The second condition in Table 2 is satisfied in the first embodiment by using substantially nontransmissive insulating walls with a low thermal conductance to block substantially all direct radiation from the heated block (across more than 90% of the heating surface of the heated block). Generally, the radiation must be absorbed by the insulating walls 530a–d, conducted through the insulating walls 530a–d, and radiated across the insulating chamber 534 to reach the cold chamber walls 502. Further, the heating chamber 528 and insulating chamber 534 are maintained at low pressure in the first embodiment (less than 100 Torr and typically less than 20 Torr). Thus, heat must be transferred from the heated block 516 across a first vacuum region (i.e., the heating chamber 528) to the insulating walls 530a–d. The heat must then be conducted through the insulating walls 530a–d which have a low thermal conductivity (preferably less than 5 W/cmK). Then the heat must be transferred across a second vacuum region (i.e., the insulating chamber 534) to reach the cold chamber walls 502. This double vacuum insulation allows the insulating walls 530a–d to be maintained at an average temperature that is more than one half the average temperature of the heated block at thermal equilibrium even though a cold outer chamber wall is used. This reduces the rate of radiative heat transfer from the heated block (and wafer) to the insulating walls which otherwise may cause unacceptable temperature nonuniformities.

Figure 10A:
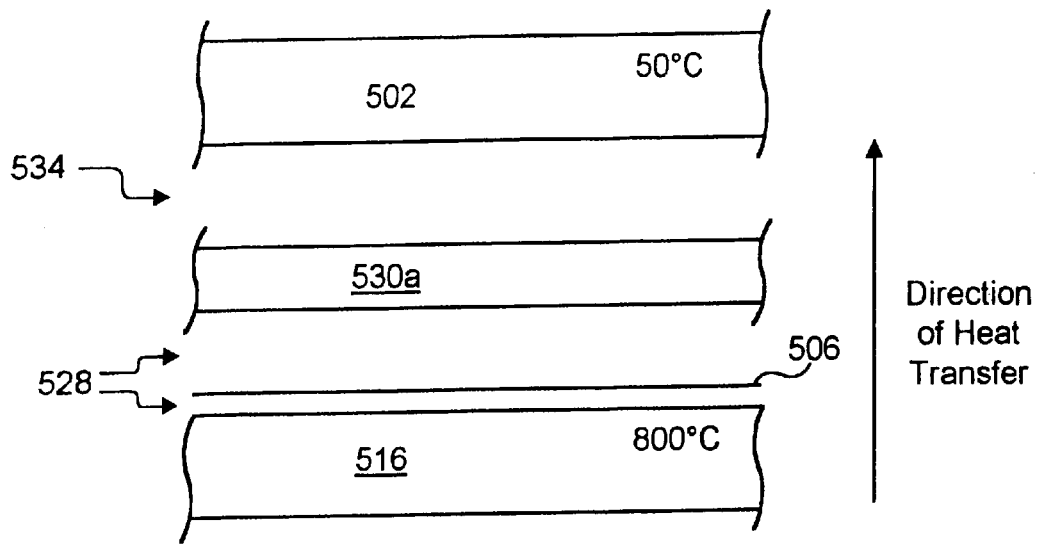
FIG. 10A illustrates a one dimensional model for estimating heat transfer in the chamber according to the first embodiment.

FIG. 10A is a one dimensional heat transfer model which is used to illustrate heat transfer in the first embodiment from the heated block 516 across a portion of the heating chamber 528 to the wafer 506, from the wafer 506 across the rest of the heating chamber 528 to the top insulating wall 530a, through the insulating wall 530a, across the insulating chamber 534 and to the chamber wall 502. For this example, the heated block is assumed to be at eight hundred degrees Celsius (800° C.) and the chamber wall is at fifty degrees Celsius (50° C.). The gas in the chamber is nitrogen at ten (10) Torr. The emissivity of the heated block is approximately eight tenths (0.8); the emissivity of the wafer is approximately sixty nine hundredths (0.69); the emissivity of the top insulating wall is approximately five hundredths (0.05); and the emissivity of the aluminum chamber walls is approximately twenty five hundredths (0.25). The wafer is thirty five thousandths (0.035) of an inch thick and the top insulating wall is three hundred seventy five thousandths (0.375) of an inch thick. The insulating wall has a thermal conductivity of three and one half Watts per centimeter Kelvin (3.5 W/cmK).

Figure 10B:
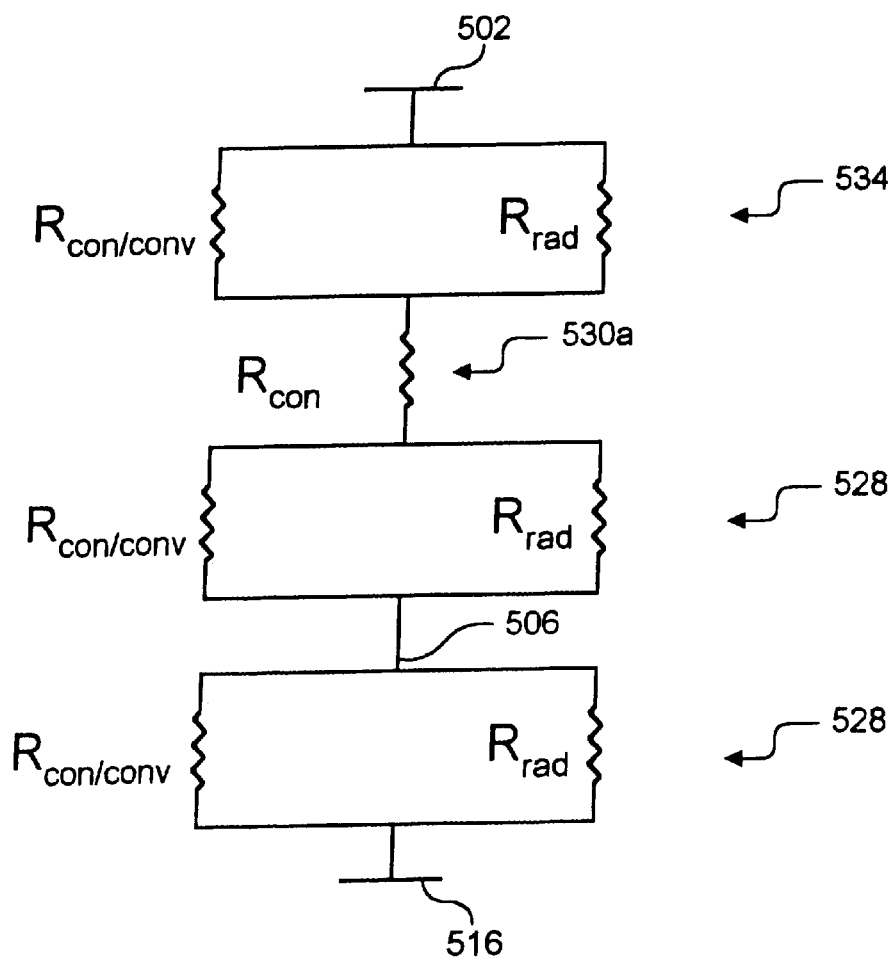
FIG. 10B is a thermal equivalent circuit for the heat transfer model shown in FIG. 10A.

FIG. 10B illustrates a thermal "equivalent circuit" for the heat transfer model with thermal resistances shown as resistors. FIG. 10B illustrates that parallel paths of conduction/convection, $R_{con/conv}$, and radiation, $R_{rad}$, allow heat transfer from the heating surface to the wafer, from the wafer to the insulating wall, and from the insulating wall to the chamber wall. Heat transfer through the insulating wall 530a is by conduction only. The equations for conduction, convection and radiation described previously may be used to determine the theoretical heat transfer across the four regions (block to wafer, wafer to insulating wall, through insulating wall, and insulating wall to chamber walls) with the temperatures of the wafer, $T_W$, lower surface of the insulating walls, $T_L$, and upper surface of the insulating walls, $T_U$, and the heat flux being unknowns. This leads to four equations with four unknowns which can be solved using techniques known in the art.

FIG. 10C is a table of temperatures calculated using the above heat transfer model for given distances between the heated block and wafer at a given heating surface temperature (800° C.) and pressure (10 Torr). As shown in FIG. 10C, the average temperature of the top insulating wall is maintained at an average temperature over six hundred degrees Celsius (600° C.) with an average heating surface temperature $T_H$ of eight hundred degrees Celsius (800° C.). Therefore, $\Delta T_{AV}$ is less than two hundred degrees Celsius (200° C.) which easily satisfies the second condition in Table 2. This greatly reduces radiative heat losses (by a factor of roughly two or three) relative to the radiative heat losses in the absence of the insulating wall.

It will also be noted from FIG. 10C that the wafer temperature, $T_W$, is very close to the temperature of the heating surface when the wafer is positioned close to the heating surface. This indicates a low conductive thermal resistance for small gaps which, as described above with reference to the first condition in Table 2, is desired in the first embodiment. Preferably, the wafer is placed in substantial contact with the heating surface during processing. The wafer temperature $T_W$ quickly decreases as the wafer is moved away from the heating surface at ten (10) Torr as indicated in FIG. 10C. This is due to the high conductive resistance across the gap at low vacuum pressure. Thus, the gap should be limited as necessary to achieve a desired wafer temperature.

The base insulating wall 530c is closer to the heated block than the top insulating wall 530a used in the heat transfer model of FIG. 10. Therefore, the base insulating wall 530c tends to be hotter than the top insulating wall 530a and radiation from the edge of the heating surface is further reduced. This is desirable since radiative losses from the edge of the heating surface can lead to undesired lateral thermal gradients. In order to avoid thermal gradients due to excessive edge radiation, it is preferred that the third condition in Table 2 be satisfied where $T_{edge}$ is the average temperature of chamber surfaces receiving direct radiation from the corner edge of the heating surface (shown at 702 in FIG. 7), and $T_H$ is the average temperature of the heating surface. As indicated by the third condition, it is preferred that the average temperature $T_{edge}$ of all chamber surfaces that receive direct radiation from corner edge 702 have a relatively high temperature at thermal equilibrium relative to the heating surface. To the extent that there are significant radiative edge losses, it is desirable to extend the heating surface 518 radially outward from the wafer edges in order to compensate (i.e., by increasing $R_H/R_W$). The third condition in Table 2 is satisfied in the first embodiment since substantially all direct radiation from the corner edge 702 of the heating surface is intercepted by the closely spaced base insulating wall 530c. Unlike many conventional systems, there is no direct radiative path from the edge of the heated block to cold chamber walls or other chamber surfaces with temperatures less than one half of the average temperature of the heated block.

In the first embodiment all of the conditions set forth in Table 2 are satisfied and pressure is reduced to very low levels. This provides a very energy efficient chamber and allows a compact design to be used. In addition, a high level of wafer temperature uniformity is maintained across a range of temperatures even though the cold chamber walls are relatively close to the edges of the heated block and wafer.

Figure 11:
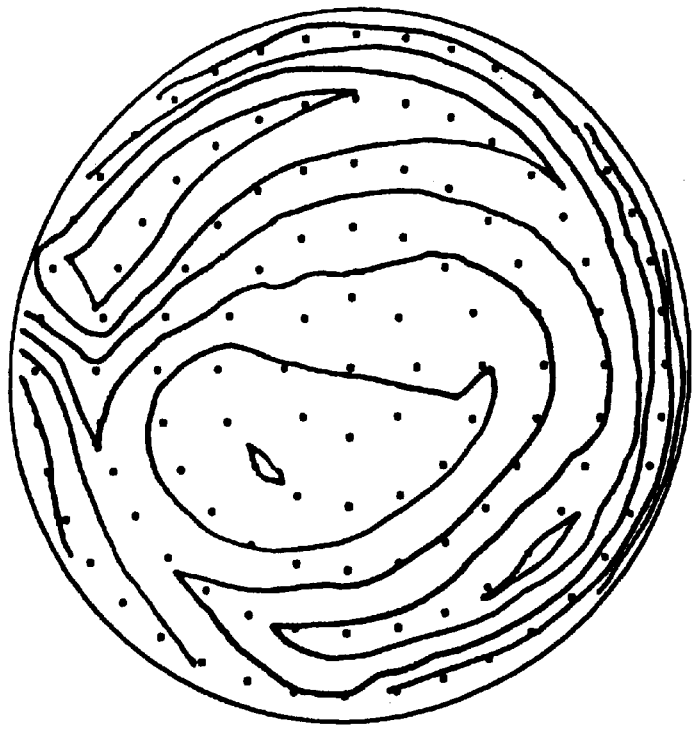
FIG. 11 shows wafer sheet resistance uniformity maps before and after titanium silicide anneal in the thermal processing chamber according to the first embodiment.
Figure 11:
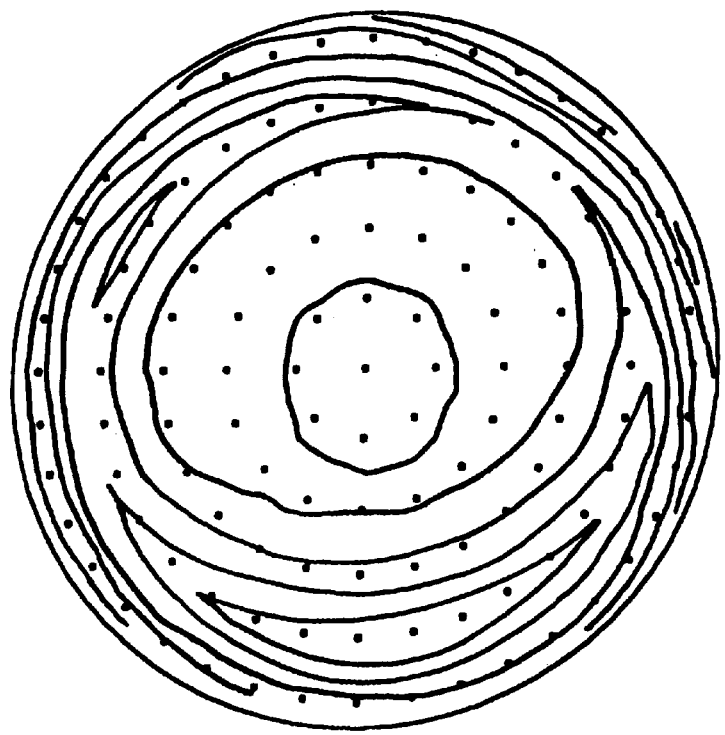

This uniformity is reflected in the results of a titanium silicide anneal carried out in the thermal processing chamber according to the first embodiment. Titanium was deposited upon a two hundred millimeter (200 mm) wafer. The uniformity was measured on a sheet resistivity mapping system using 121 measurement points. Prior to annealing, the wafer sheet resistance uniformity had a standard deviation of 1.81 percent. The mean was 11.69 ohms/sq., the minimum was 11.23 ohms/sq., and the maximum was 12.12 ohms/sq. The wafer was then placed in the thermal processing chamber and a first step anneal was performed at approximately 660° C. After annealing, the wafer sheet resistance uniformity had a standard deviation of 1.755 percent. The mean was 7.821 ohms/sq., the minimum was 7.511 ohms/sq. and the maximum was 8.097 ohms/sq. FIG. 11 shows wafer sheet resistance uniformity maps both before and after annealing. Surprisingly, uniformity was actually improved slightly by annealing and this result was achieved without rotation.

Significantly, the uniformity is better than uniformity typically reported for lamp systems even though such systems often use dozens of lamps arranged in multiple independently controlled heating zones and some systems rotate the wafer to enhance uniformity. In contrast, the thermal processor of the first embodiment uses a single zone heater to process two wafers at a time, does not require rotation, may be controlled with an emissivity independent thermocouple embedded in the heated block, and has an extremely compact and cost effective design. Further, the power consumed by the chamber of the first embodiment is many times less than in modern lamp RTP systems.

In addition, the heated block may be continuously maintained at an elevated temperature, and the Aspen™ system or a similar wafer handling system may be used to load and unload two wafers at a time with substantially continuous processing. A throughput of approximately ninety (90) wafers may be achieved for titanium silicide anneal which is well above throughput reported for all lamp systems known to applicant and a throughput of up to one hundred and twenty (120) wafers per hour is anticipated.

In addition, a single silicon carbide coated graphite heater mounted to a single power source may be used to uniformly process two wafers at a time. This is advantageous since graphite heaters are expensive and may be damaged during mounting.

Figure 12:
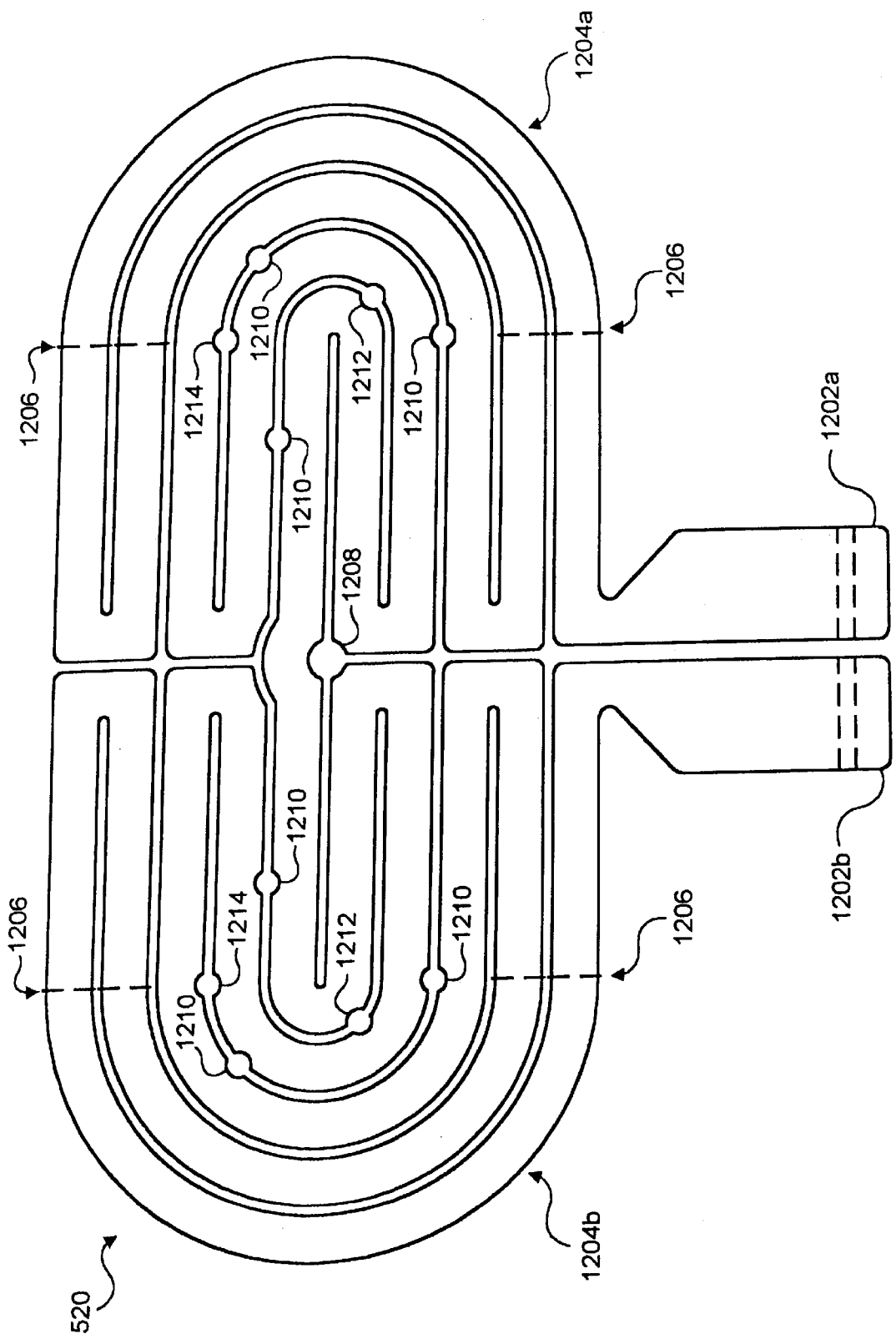
FIG. 12 is a top view of a resistive heater according to the first embodiment.

FIG. 12 is a top plan view of the resistive silicon carbide coated graphite heater 520 used in the first embodiment. The resistive heater provides a single conductive path between power input terminal 1202a and power output terminal 1202b. The conductive path loops back and forth to form a heater having curved edges 1204a and 1204b on two sides. The curved edges trace out half circular regions slightly larger than one half of a wafer. The conductive path also traces out a rectangular heating region between the two half circular regions such that the graphite heater may be used to heat two wafers at the same time. Due to the oval-like shape of the resistive heater, the power of the heater must be varied along the conductive path to provide uniform heating. In particular, the outer two turns of the conductive path along the perimeter of the half circle (between dashed lines 1206 indicated in FIG. 12) provide a higher resistance and therefore dissipate more energy than the rest of the heater. Whereas the majority of the conductive path has a thickness of approximately one quarter (0.25) of an inch in the first embodiment, these regions have a thickness of one eighth (0.125) of an inch as shown in the cross section of FIG. 5. Since the cross sectional area of the conductive path is halved, the resistance is approximately doubled. Of course, the cross sectional area (and therefore the power) of the conductive path may be varied among multiple values throughout the heater to enhance wafer temperature uniformity. By varying the power provided in different regions of the heater, non-circular heater shapes may be used to accommodate multiple wafers. For instance, a clover leaf design with a higher resistance along its perimeter might be used to process four wafers at a time with acceptable uniformity. While power dissipation may be varied across the heater, it is believed that, due in part to the thermal conditions satisfied in the first embodiment, a single zone heater (i.e., with a single power control) may be used to achieve acceptable uniformity across a wide range of processing temperatures.

As shown in FIG. 12, holes may be formed in the resistive heater to allow devices to pass through the heater. For instance a center hole 1208 may be formed to allow support to pass through the heater and support the heated block. Preferably, supports comprise an insulating material such as opaque quartz and are positioned in the central region of the chamber to avoid interference with the heating of the wafers. In addition, holes 1210 may be provided below each wafer pocket to allow the pins to reach the wafer. A corresponding hole is also formed in the heated block for each pin. In the first embodiment, there are three pins for raising and lowering each wafer. Holes 1212 may also be provided so thermocouples can be inserted into the heated block.

In addition, holes 1214 may be formed in the heater with corresponding holes in the heated block to allow an optical sensor or thermocouple to sense radiation from the backside surface of the wafer for temperature measurement and control. By inserting the optical sensor through the hole, extraneous radiation in the chamber can be blocked to avoid interference with the optical sensor. In addition, the hole in the heated block may be designed to form an effective black body cavity which substantially reduces the dependence of the temperature measurement on the wafer's emissivity. See copending U.S. patent application Ser. No. 08/451,789, entitled "Semiconductor Substrate Processing System and Method Providing Shielded Optical Pyrometry," filed May 26, 1995 in the names of Kristian E. Johnsgard and James McDiarmid and assigned of record to the assignee of the present invention, the entire disclosure of which is incorporated herein by reference.

While the resistive beater in FIG. 12 has advantageous thermal properties, it preferably comprises silicon carbide coated graphite and is relatively fragile and expensive. The heater is particularly susceptible to damage from shear strain during mounting. In order to reduce the potential for damage, the heater mounting mechanism shown at 524 in FIG. 5 is used in the first embodiment. As shown in FIG. 5, the heater extends horizontally through a slot in the chamber wall into a heater mounting chamber 542. As shown in FIG. 12, each end of the conductive graphite path which forms the heater extends horizontally so it may be inserted into the heater mounting chamber 542. Each of these ends provides a terminal 1202a and 1202b which may be mounted to a power source.

Figure 13A:
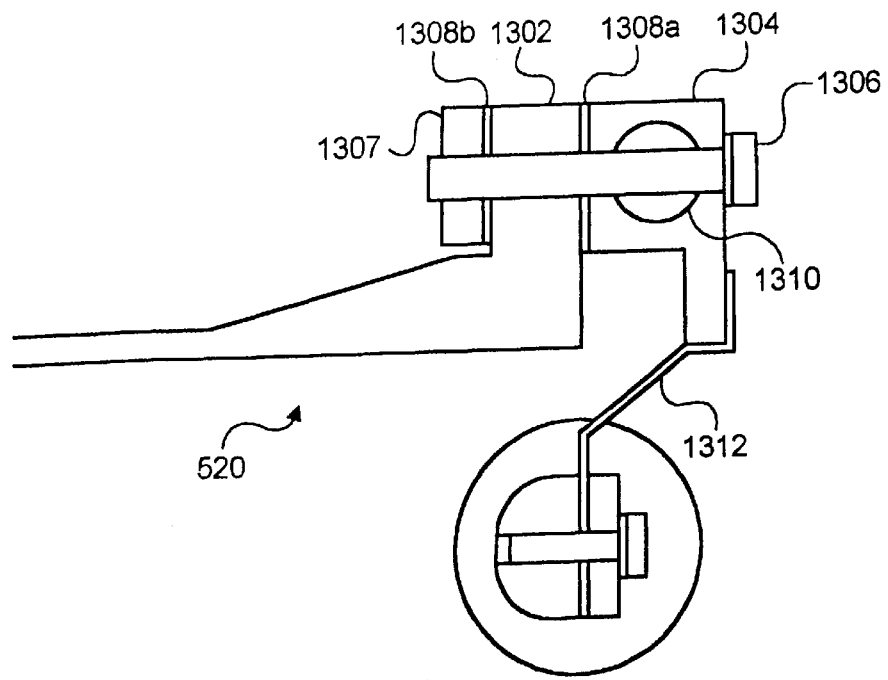
FIG. 13A is a side cross sectional view of a heater mounting mechanism according to the first embodiment.
Figure 13B:
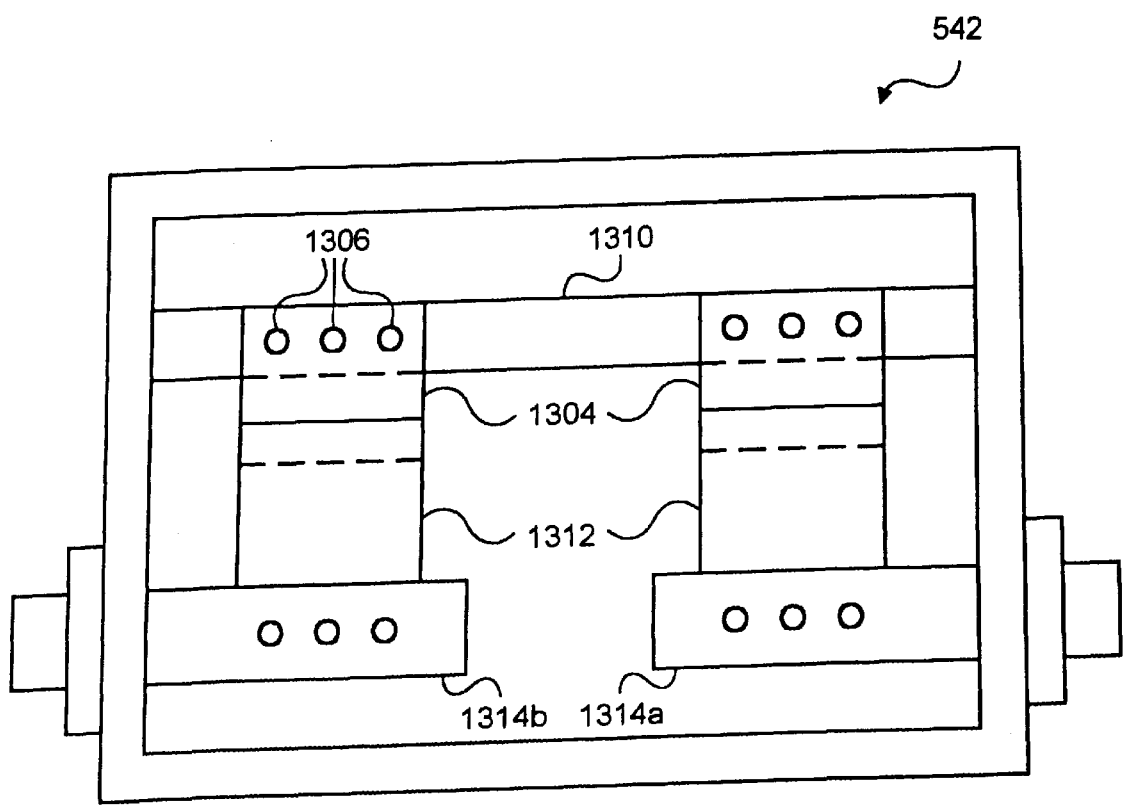
FIG. 13B is a front view of a heater mounting mechanism according to the first embodiment.

The heater mounting mechanism is shown in additional detail in FIGS. 13A and 13B. As shown in FIG. 13A, the ends of the graphite heater form a vertical tab 1302 which is mounted to a block of electrically conductive material 1304. In the first embodiment, the block 1304 is formed from silver plated copper. A silver plating is used to passivate the reactive copper and to enhance electrical conductivity between the block 1304 and the heater. The vertical tab 1302 is mounted to the conductive block 1304 using three bolts or clamps 1306 and a base plate 1307 made out of a refractory material such as monel. The portion of the heater placed in contact with the conductive block 1304 is uncoated graphite which provides improved electrical conduction from the block to the heater.

In addition, a malleable conductive material 1308a, such as pure silver foil or the like, is placed between the conductive block and the heater. A malleable conductive material 1308b may also be placed between the base plate 1307 and the heater. When the heater is clamped, the malleable conductive material conforms to the surfaces of the heater interface, filling micropits which prevents microarcing and thus provides an enhanced and more durable electrical connection. This provides an advantage over many conventional graphite heaters which often have a poor electrical connection.

In addition, the heater 520 is preferably uncoated across the entire area that makes electrical contact with the conductive block 1304, bolts 1306, and base plate 1307. Conventional graphite heaters often expose the graphite on one surface only to minimize the potential for contamination while leaving other mounting surfaces clamped directly against a silicon carbide coating. The silicon carbide coating may crack due to clamping which can cause arcing and which may vary the properties of the electrical connection over time. This can decrease processing repeatability and in some cases can cause the heater to fail. In order to overcome these problems, the heater in the first embodiment is uncoated on each surface that is clamped. Since the exposed graphite surfaces are covered by the mounting mechanism when clamped, contamination does not occur. In addition, the potential for contamination is further reduced by isolating the exposed graphite surfaces in the separate heater mounting chamber. Thus, an improved electrical contact may be achieved by mounting the conductive block and base plate against exposed graphite surfaces. As described above, a malleable conductive material may also be clamped against the exposed graphite surfaces to further improve the electrical connection.

The bolts 1306 use compressive (as opposed to shear) force to hold the graphite heater 520 and conductive block 1304 together. This compressive force does not damage the heater even when the bolts and heater expand during heating. However, shear stress may damage the heater when torque is applied to the bolts. To prevent shear stress from damaging the heater, a ceramic mounting rod 1310 is inserted through the conductive block 1304 and mounted to a fixed support such as the mounting chamber wall. The mounting rod 1310 forms through holes that align with holes in the conducting block and heater. The bolts 1306 are inserted through the holes and torque is applied to the bolts to clamp the heater 520 to the conducting block 1306. The mounting rod 1310 is transverse to the bolts to prevent the torque that is applied to the bolts from moving the conducting block 1304 and damaging the heater 520.

While the mounting rod 1310 prevents torque from being applied to the heater, the rod is preferably mounted such that it may rotate about its central axis. This allows the conducting block 1304 to pivot or swivel as necessary to maintain a good contact with the heater 520 without shear stress. In order to allow the conductive block to swivel, a flexible conductive sheet 1312, preferably silver plated copper, is used to provide power to the conductive block. The conductive sheet 1312 is connected to the conductive block 1304 on one end and to a power input rod 1314*a* or power output rod 1314*b* on the other end as shown in FIGS. 13A and 13B. This conductive sheet 1312 will flex to allow the conductive block 1304 to swivel and mate evenly with vertical tab 1302 thereby minimizing shear stress.

It will be noted that the electrical path provided by the mounting mechanism for power input and output is relatively wide with a lower resistance than the conductive path used to resistively heat the wafer. This prevents undue heating in the heater mounting chamber 542 and also reduces thermal expansion of the heater in the heater mounting chamber.

In addition to reducing shear stress on the resistive heater 520, the mounting mechanism allows the heater to be closely spaced to the heated plate 516. Since the heater is mounted from the side, it tends to expand horizontally rather than vertically when heated. The heater support pins shown at 522 in FIG. 5 are not fixed to the heated block 516 or bottom insulating wall 530*d*, so the heater can expand horizontally when heated. However, since a vertical mounting arm is not used, the heater does not expand much in the vertical direction. This allows the heater to be closely spaced to the heated block which improves heating and reduces chamber dimensions.

The resistive heater 520 and heated block 516 combine to form a stable, large thermal mass heat source for wafer processing. While this provides process uniformity and repeatability, it is difficult to rapidly adjust the rate of wafer heating in the first embodiment to achieve desired processing temperature profiles. Due to the large thermal mass of the heated block, it is not practical to rapidly heat and cool the block to control the rate of heating. Rather the rate of heating is controlled by altering the thermal conductive resistance between the heating surface 518 and the wafer 506.

One approach to varying the rate of heating is to alter the distance between the wafer 506 and the heating surface 518. Initially the wafer could be placed on the heating surface and as a desired processing temperature is approached the wafer could be moved away from the heating surface 518 to maintain the temperature at a relatively constant level. However, as described previously, it is desirable to heat the wafer on or very near the heating surface to achieve a high level of uniformity in a compact chamber design. In addition, if proximity heating is used, an optical sensor or thermocouple deployed through a hole in the heated block will no longer be completely covered by the wafer. As a result, radiation from the heating chamber may interfere with optical pyrometry. Further, if the temperature is measured using a thermocouple in the heated block, the temperature may not be representative of the actual wafer temperature if proximity heating is used.

Thus, in the first embodiment, it is preferable to alter the thermal resistance between the wafer and heated block using other techniques. The approach used in the first embodiment is to place the wafer very close to, or in contact with the heated block and then to vary the chamber pressure across a range of low pressures typically less than fifty (50) Torr. This technique has been used to widely vary the rate of heating using a small change in pressure. As described above, changing the mean free path by altering pressure can drastically change the rate of conductive heating when the mean free path is significant relative to the geometric distance between the wafer and the heating surface (the rarified gas regime).

FIG. 14A is a graph illustrating the temperature profiles of a wafer heated at fifty (50) Torr and two (2) Torr in a thermal processor according to the first embodiment. The vertical axis represents temperature in degrees Celsius and the horizontal axis represents time in seconds measured from the time that a wafer is inserted into the chamber. The temperature of the heated block was approximately six hundred sixty degrees Celsius (660° C.) and the desired wafer processing temperature was six hundred fifty degrees Celsius (650° C.). The pins 510 were lowered and the wafer 506 was placed on the heating surface 518 approximately fifteen (15) seconds after the wafer was initially inserted into the chamber. Due to the high transmission of a silicon wafer at low temperatures and the thermal resistance at vacuum pressure, the wafer was not rapidly heated until the pins were lowered. The solid line 1402 in FIG. 14A represents the temperature of the wafer over time at a pressure of two (2) Torr, and the dashed line 1404 represents the temperature of the wafer over time at a pressure of fifty (50) Torr. The temperatures were measured using optical pyrometry with an optical sensor inserted through a hole in the heated block to view the backside of the wafer. As can be seen in FIG. 14A, the initial rate of heating at fifty (50) Torr (as indicated by the slope of the dashed line 1404) is significantly higher than at two (2) Torr (as indicated by the slope of the solid line 1402).

Figure 14B:
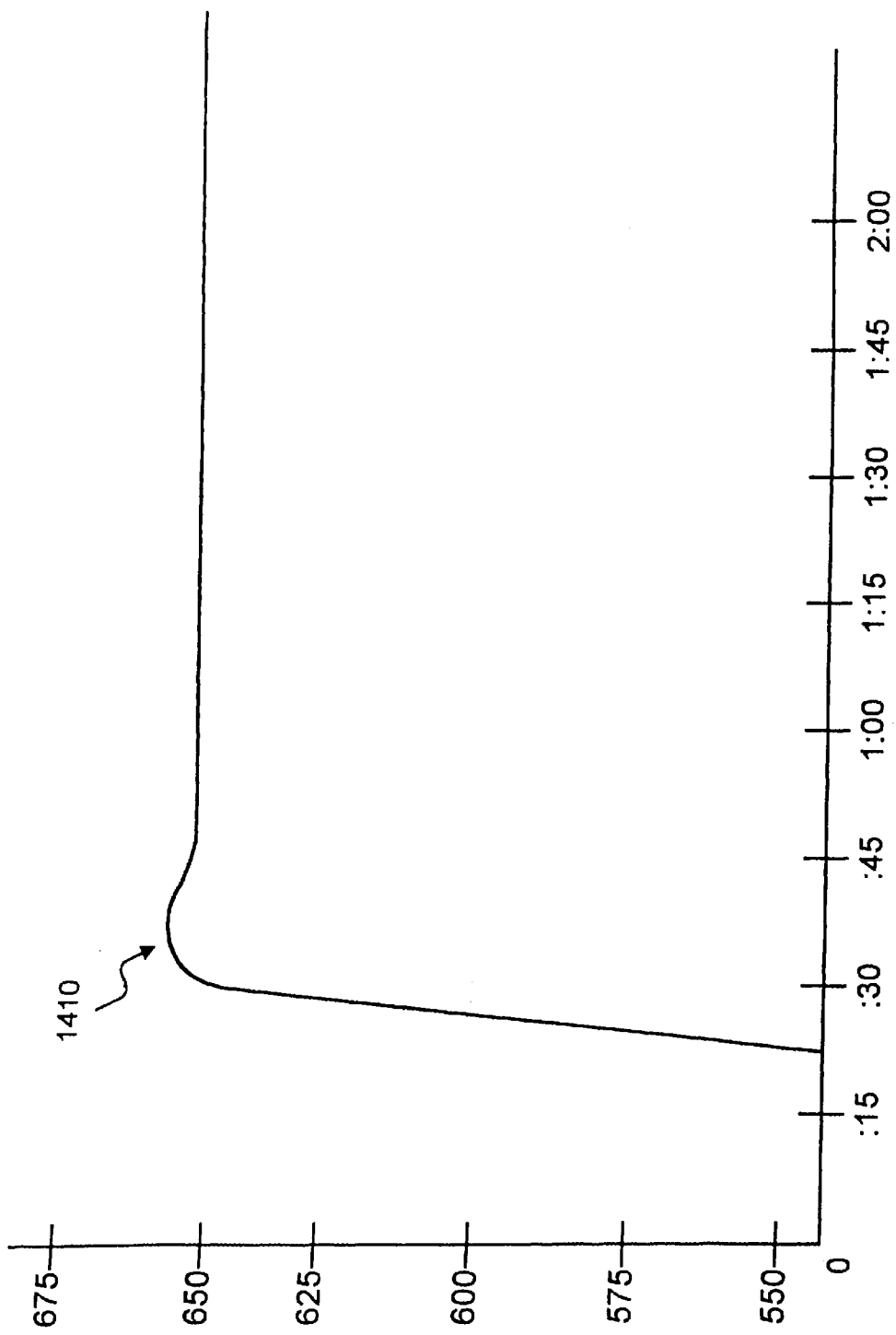
FIG. 14B is a graph illustrating the temperature of a wafer heated at multiple pressures during processing in a chamber according to the first embodiment.
Figure 14B:
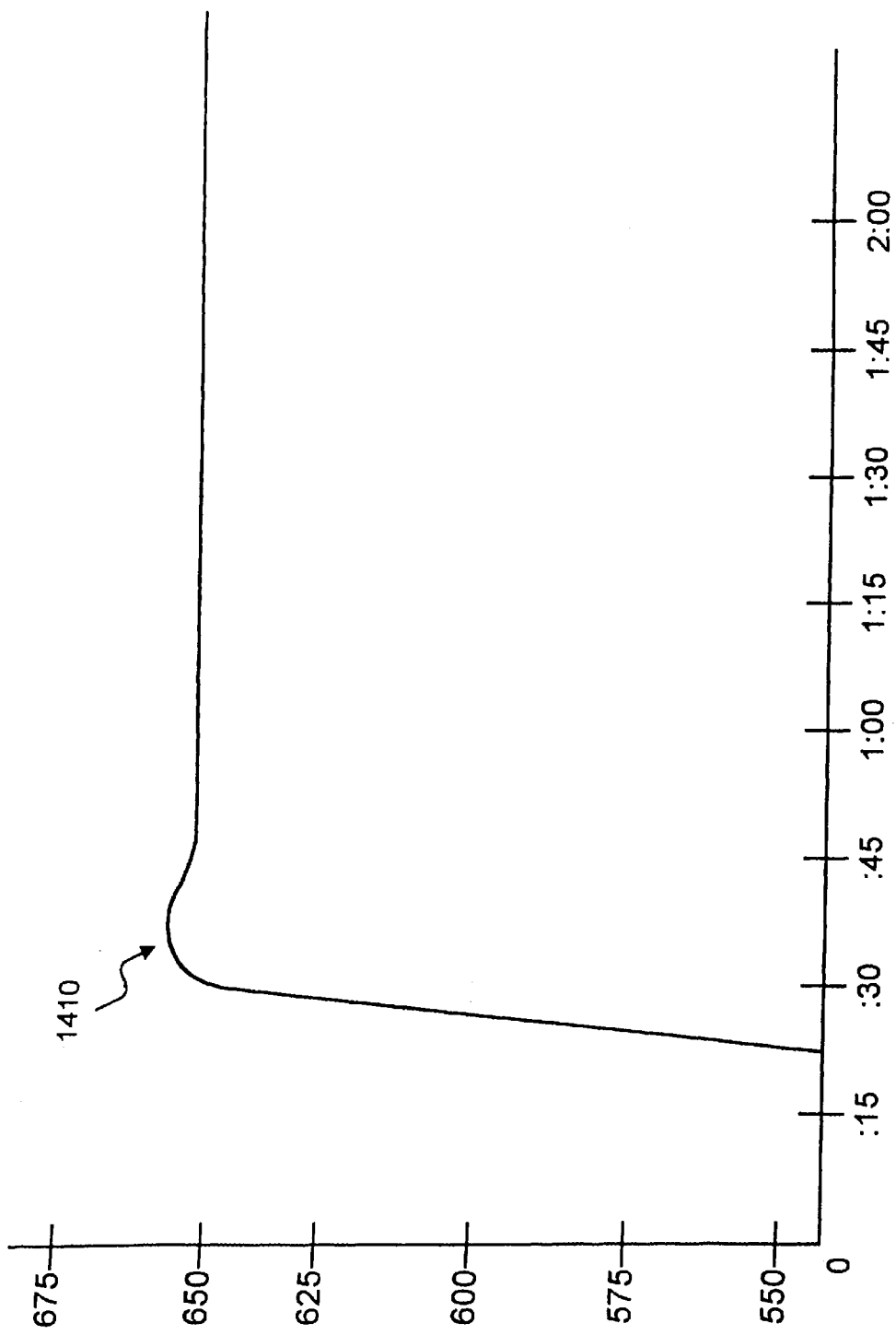

FIG. 14B is a graph of wafer temperature over time where a wafer was heated at fifty (50) Torr for approximately fifteen (15) seconds and then at two (2) Torr for the remainder of the process. When the wafer was initially placed in the chamber, the pressure was approximately two (2) Torr. As the pins were lowered, the pressure was increased to fifty (50) Torr for about fifteen (15) seconds. As the desired processing temperature approached, the chamber was evacuated to approximately two (2) Torr. It will be appreciated that the compact design of the chamber in the first embodiment allows the gas exhaust system to rapidly adjust the pressure in the chamber to modify the heating rate. As shown at 1410 in FIG. 14B there is some overheating of the wafer at fifty (50) Torr. The temperature dips slightly below six hundred fifty degrees Celsius (650° C.) when the pressure is lowered and then increases very gradually.

It is believed that the temperature profile in FIG. 14B may be further improved by reducing the pressure in multiple steps as the desired processing temperature is approached. For instance, the initial chamber pressure may be two and four tenths (2.4) Torr, and the pressure may be raised to fifty (50) Torr when the pins are lowered. The wafer may be heated at fifty (50) Torr for approximately eight (8) seconds and then at five (5) Torr for approximately ten (10) seconds. The pressure may then be reduced from five (5) Torr to two and four tenths (2.4) Torr over the remainder of the process. It is believed that this process will provide a rapid heat ramp up (about 25° C.) followed by a relatively constant processing temperature (in this case approximately 650° C.).

It will be readily apparent to those of ordinary skill in the art that the above technique may be applied to achieve a large variety of temperature profiles. This technique may be applied at low pressures (generally less than 100 Torr) with short distances between the wafer and the heating surface (generally less than 0.0625 of an inch). In particular, the processing pressure is varied across a range that includes at least one pressure in the rarified gas regime. In the first embodiment, the range preferably includes at least one pressure at or above ten (10) Torr and one pressure below ten (10) Torr.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

What is claimed is:

1. A method for thermally processing a semiconductor substrate with a desired heating profile, the method comprising the steps of:
   providing a heating surface within a processing chamber;
   placing the semiconductor substrate adjacent to the heating surface for heating; and
   varying the processing pressure within the chamber with a heat transfer gas to alter the rate of heating to achieve the desired heating profile;
   wherein the heat transfer gas conductively transfers heat from the heated surface to the semiconductor substrate.

2. The method of claim 1, wherein the processing pressure is varied across a range of pressures less than one hundred (100) Torr.

3. The method of claim 1, wherein the semiconductor substrate is placed at an average distance from the heating surface that is no greater than one sixteenth of an inch.

4. The method of claim 1, wherein the step of placing the semiconductor substrate adjacent to the heating surface further comprises the step of placing the semiconductor substrate in contact with the heating surface.

5. The method of claim 1, wherein the step of providing a heating surface further comprises the step of providing a heat source having a thermal mass much greater than the thermal mass of the semiconductor substrate.

6. The method of claim 5, further comprising the step of maintaining the heat source at a substantially constant temperature.

7. The method of claim 1, wherein the step of varying the processing pressure further comprises the steps of:
   heating the semiconductor substrate at a first pressure of at least ten (10) Torr; and
   heating the semiconductor substrate at a second pressure less than ten (10) Torr.

8. The method of claim 1, wherein the desired heating profile includes a period of temperature ramp up for the semiconductor substrate and a period of substantially constant temperature for the semiconductor substrate.

9. The method of claim 8, wherein the step of varying the processing pressure further comprises the steps of:
   providing a first pressure in the processing chamber during the period of temperature ramp up for the semiconductor substrate; and
   providing a second pressure in the processing chamber during the period of substantially constant temperature for the semiconductor substrate;
   wherein the first pressure is at least twice as large as the second pressure.

10. The method of claim 9, wherein the first pressure is within the range of from ten (10) Torr to two hundred (200) Torr and the second pressure is less than ten (10) Torr.

11. The method of claim 10, wherein the semiconductor substrate is placed an average distance from the heating surface that is no greater than one sixteenth of an inch.

12. The method of claim 11, wherein the step of providing a heating surface further comprises the step of providing a heat source having a thermal mass much greater than the semiconductor substrate.

13. The method of claim 12, further comprising the step of maintaining the heat source at a substantially constant temperature.

14. The method of claim 9, wherein an initial rate of temperature ramp up for the semiconductor substrate at the first pressure is at least fifty percent (50%) greater than an initial rate of temperature ramp up for the semiconductor substrate that would occur at the second pressure.

15. A method for thermally processing a semiconductor substrate with a desired heating profile, the method comprising the steps of:
   providing a heating surface within a processing chamber;
   placing the semiconductor substrate adjacent to the heating surface for heating;
   heating the semiconductor substrate initially at a processing pressure that allows conductive and radiative heat transfer; and
   lowering the processing pressure to reduce the amount of conductive heat transfer as a desired processing temperature is approached.

16. The method of claim 15, wherein the processing pressure is varied across a range of pressures less than one hundred (100) Torr.

17. The method of claim 15, wherein the initial processing pressure that allows conductive and radiative heat transfer is at or above ten (10) Torr, and the lowered processing pressure that reduces the amount of conductive heat transfer is below ten (10) Torr.

18. The method of claim 17, wherein the initial processing pressure that allows conductive and radiative heat transfer is about fifty (50) Torr, and the lowered processing pressure that reduces the amount of conductive heat transfer is about two (2) Torr.

19. The method of claim 17, where in the initial processing pressure that allows conductive and radiative heat transfer is about fifty (50) Torr, and the lowered processing pressure that reduces the amount of conductive heat transfer is first about five (5) Torr and then about two (2) Torr.

20. The method of claim 15, wherein the semiconductor substrate is placed at an average distance from the heating surface that is no greater than one sixteenth of an inch.

21. The method of claim 20, wherein the step of placing the semiconductor substrate adjacent to the heating surface further comprises the step of placing the semiconductor substrate in contact with the heating surface.

22. The method of claim 15, wherein the step of providing a heating surface further comprises the step of providing a heat source having a thermal mass much greater than the thermal mass of the semiconductor substrate.

23. The method of claim 15, further comprising the step of maintaining the heat source at a substantially constant temperature.

* * * * *